United States Patent
Conti et al.

(10) Patent No.: US 12,408,469 B1
(45) Date of Patent: Sep. 2, 2025

(54) OPTIMIZING CADMIUM (Cd) ALLOY SOLAR CELLS WITH SPUTTERED COPPER-DOPED ZINC TELLURIDE (ZnTe:Cu) BACK CONTACTS IN THE PRESENCE OF HYDROGEN

(71) Applicant: Conti Innovation Center, LLC, Orlando, FL (US)

(72) Inventors: Kurt G. Conti, New Providence, NJ (US); Cullin J. Wible, Austin, TX (US); Tim Gessert, Conifer, CO (US)

(73) Assignee: Conti Innovation Center, LLC, Orlando, FL (US)

( * ) Notice: Subject to any disclaimer, the term of this patent is extended or adjusted under 35 U.S.C. 154(b) by 0 days.

(21) Appl. No.: 19/098,014

(22) Filed: Apr. 2, 2025

Related U.S. Application Data

(62) Division of application No. 19/009,396, filed on Jan. 3, 2025.

(51) Int. Cl.
*C23C 16/52* (2006.01)
*H01J 37/32* (2006.01)
(Continued)

(52) U.S. Cl.
CPC ......... *H10F 71/1253* (2025.01); *C23C 16/52* (2013.01); *H01J 37/32522* (2013.01);
(Continued)

(58) Field of Classification Search
CPC ............. H01J 37/3476; H01J 37/32522; H01J 37/32724; C23C 16/52; H10F 71/1253;
(Continued)

(56) References Cited

U.S. PATENT DOCUMENTS

| 4,461,922 A | 7/1984 | Gay et al. |
| 4,888,062 A | 12/1989 | Nakagawa |

(Continued)

FOREIGN PATENT DOCUMENTS

| AT | 16573 | 1/2020 |
| CN | 103000738 | 3/2013 |

(Continued)

OTHER PUBLICATIONS

Australian Office Action issued on Jul. 16, 2024 for Australian Patent Application No. 2022291777.
(Continued)

*Primary Examiner* — Rodney G Mcdonald
(74) *Attorney, Agent, or Firm* — Volpe Koenig

(57) ABSTRACT

A method of manufacturing a cadmium (Cd) alloy transmissive solar cell is provided. The method includes pumping a vacuum chamber to a base pressure and pumping the vacuum chamber to a sputtering pressure. The method includes providing into the vacuum chamber a first gas at a rate that balances a flow of the first gas in and out of the vacuum chamber with respect to the sputtering pressure and heating a surface of a partially manufactured cadmium (Cd) alloy transmissive solar cell within the vacuum chamber to a calibrated deposition temperature. The method includes providing into the vacuum chamber a second gas including at least a hydrogen gas ($H_2$) at a proportional rate to achieve a target gas mix while maintaining the sputtering pressure and depositing a target material onto the surface to form a back contact section of the cadmium (Cd) alloy transmissive solar cell.

20 Claims, 9 Drawing Sheets

(51) Int. Cl.
*H01J 37/34* (2006.01)
*H10F 10/162* (2025.01)
*H10F 71/00* (2025.01)

(52) U.S. Cl.
CPC .... *H01J 37/32724* (2013.01); *H01J 37/3476* (2013.01); *H10F 10/162* (2025.01); *H10F 71/125* (2025.01); *H10F 71/128* (2025.01); *H10F 71/138* (2025.01); *H10F 71/1257* (2025.01)

(58) Field of Classification Search
CPC .... H10F 71/162; H10F 71/138; H10F 71/128; H10F 71/125; H10F 71/1257
USPC .......................................... 204/192.13; 427/8
See application file for complete search history.

(56) References Cited

U.S. PATENT DOCUMENTS

| | | |
|---|---|---|
| 4,909,857 A | 3/1990 | Ondris |
| 4,959,106 A | 9/1990 | Nakagawa |
| 5,261,969 A | 11/1993 | Stanbery |
| 5,393,675 A | 2/1995 | Compaan |
| 5,897,715 A | 4/1999 | Ward |
| 5,922,142 A | 7/1999 | Wu |
| 6,281,035 B1 | 8/2001 | Gessert |
| 6,458,254 B2 | 10/2002 | Gessert |
| 6,852,614 B1 | 2/2005 | Compaan |
| 7,098,058 B1 | 8/2006 | Karpov |
| 7,141,863 B1 | 11/2006 | Compaan |
| 7,517,784 B2 | 4/2009 | Li |
| 8,124,870 B2 | 2/2012 | Woods |
| 8,143,515 B2 | 3/2012 | Gossman et al. |
| 8,224,189 B1 | 7/2012 | Frolov |
| 8,253,012 B2 | 8/2012 | Gessert |
| 8,293,009 B2 | 10/2012 | Sachs |
| 8,298,856 B2 | 10/2012 | Garnett |
| 8,373,060 B2 | 2/2013 | Munteanu |
| 8,425,978 B2 | 4/2013 | Gessert |
| 8,448,898 B1 | 5/2013 | Frolov |
| 8,455,808 B1 | 6/2013 | Frolov |
| 8,461,504 B1 | 6/2013 | Frolov |
| 8,519,435 B2 | 8/2013 | Vasko |
| 8,568,828 B2 | 10/2013 | Li |
| 8,569,613 B1 | 10/2013 | Brown |
| 8,580,603 B2 | 11/2013 | Basol |
| 8,633,052 B2 | 1/2014 | Polito |
| 8,664,524 B2 | 3/2014 | Garnett |
| 8,696,810 B2 | 4/2014 | Hantsoo |
| 8,734,621 B2 | 5/2014 | Gessert |
| 8,741,688 B2 | 6/2014 | Quick |
| 8,746,620 B1 | 6/2014 | Moussouris |
| 8,747,630 B2 | 6/2014 | Gessert |
| 8,829,342 B2 | 9/2014 | Compaan |
| 8,897,770 B1 | 11/2014 | Frolov |
| 9,054,245 B2 | 6/2015 | Feldman-Peabody |
| 9,090,403 B2 | 7/2015 | Ng |
| 9,123,838 B2 | 9/2015 | Fogel |
| 9,123,844 B2 | 9/2015 | Munteanu |
| 9,136,408 B2 | 9/2015 | Irwin |
| 9,147,793 B2 | 9/2015 | Gessert |
| 9,159,851 B2 | 10/2015 | Liu |
| 9,269,849 B2 | 2/2016 | Yu |
| 9,305,715 B2 | 4/2016 | Irwin |
| 9,306,107 B2 | 4/2016 | Hong |
| 9,331,292 B2 | 5/2016 | Irwin |
| 9,391,700 B1 | 7/2016 | Bruce |
| 9,416,279 B2 | 8/2016 | Irwin |
| 9,425,346 B2 | 8/2016 | Polito |
| 9,425,396 B2 | 8/2016 | Irwin |
| 9,570,795 B1 | 2/2017 | Bruce |
| 9,590,128 B2 | 3/2017 | Cauffiel |
| 9,617,431 B2 | 4/2017 | Irwin |
| 9,698,285 B2 | 7/2017 | Damjanovic |
| 9,722,111 B2 | 8/2017 | Reese |
| 9,750,795 B2 | 9/2017 | Weiner |
| 9,758,257 B1 | 9/2017 | Frolov |
| 9,799,784 B2 | 10/2017 | Allenic et al. |
| 9,841,616 B1 | 12/2017 | Bruce |
| 9,853,177 B2 | 12/2017 | Yu |
| 9,871,154 B2 | 1/2018 | Duggal et al. |
| 9,880,458 B1 | 1/2018 | Irwin |
| 9,884,966 B2 | 2/2018 | Irwin |
| 9,899,560 B2 | 2/2018 | Velappan et al. |
| 9,923,115 B2 | 3/2018 | Cauffiel |
| 9,941,480 B2 | 4/2018 | Irwin |
| 9,969,893 B2 | 5/2018 | Kim |
| 9,991,457 B2 | 6/2018 | Irwin |
| 10,043,922 B2 | 8/2018 | Heben |
| 10,062,800 B2 | 8/2018 | Blaydes et al. |
| 10,072,351 B2 | 9/2018 | Sachs |
| 10,141,473 B1 | 11/2018 | Blaydes |
| 10,189,998 B2 | 1/2019 | Irwin |
| 10,193,087 B2 | 1/2019 | Irwin |
| 10,316,196 B2 | 6/2019 | Irwin |
| 10,367,110 B2 | 7/2019 | Jin et al. |
| 10,439,095 B2 | 10/2019 | Jonczyk |
| 10,505,240 B1 | 12/2019 | Bruce |
| 10,529,883 B2 | 1/2020 | Damjanovic |
| 10,549,476 B2 | 2/2020 | Sachs |
| 10,608,190 B2 | 3/2020 | Irwin |
| 10,633,765 B2 | 4/2020 | Jonczyk |
| 10,642,147 B2 | 5/2020 | Irwin |
| 10,651,323 B2 | 5/2020 | Gessert |
| 10,741,779 B2 | 8/2020 | Irwin |
| 10,784,397 B2 | 9/2020 | Blaydes |
| 10,797,641 B2 | 10/2020 | Irwin |
| 10,896,991 B2 | 1/2021 | Jin |
| 10,907,050 B2 | 2/2021 | Irwin |
| 10,916,672 B2 | 2/2021 | Compaan |
| 10,916,712 B2 | 2/2021 | Irwin |
| 10,959,180 B2 | 3/2021 | Zhang |
| 11,024,814 B2 | 6/2021 | Irwin |
| 11,042,047 B1 | 6/2021 | Bruce |
| 11,158,749 B2 | 10/2021 | Grover |
| 11,171,290 B2 | 11/2021 | Irwin |
| 11,186,495 B2 | 11/2021 | Irwin |
| 11,264,572 B2 | 3/2022 | Irwin |
| 11,300,870 B2 | 4/2022 | Irwin |
| 11,387,779 B2 | 7/2022 | Irwin |
| 11,450,778 B2 | 9/2022 | Ring et al. |
| 11,508,924 B2 | 11/2022 | Irwin |
| 11,562,920 B2 | 1/2023 | Steeman |
| 11,784,278 B2 | 10/2023 | Andreini |
| 11,876,140 B2 | 1/2024 | Blaydes |
| 11,894,802 B2 | 2/2024 | Conti et al. |
| 12,057,803 B2 | 8/2024 | Conti et al. |
| 2004/0118451 A1 | 6/2004 | Walukiewicz |
| 2005/0012113 A1 | 1/2005 | Sheu |
| 2006/0180197 A1 | 8/2006 | Gui |
| 2008/0216885 A1 | 9/2008 | Frolov |
| 2008/0305573 A1 | 12/2008 | Sterzel |
| 2009/0014057 A1 | 1/2009 | Croft |
| 2009/0078318 A1 | 3/2009 | Meyers |
| 2009/0095348 A1 | 4/2009 | Wegmann |
| 2009/0146501 A1 | 6/2009 | Cyrus |
| 2009/0151775 A1 | 6/2009 | Pietrzak |
| 2009/0178709 A1 | 7/2009 | Huber |
| 2009/0182532 A1 | 7/2009 | Stoeber |
| 2009/0211622 A1 | 8/2009 | Frolov |
| 2009/0215215 A1 | 8/2009 | Frolov |
| 2009/0218651 A1 | 9/2009 | Frolov |
| 2009/0221111 A1 | 9/2009 | Frolov |
| 2009/0250096 A1 | 10/2009 | Pan |
| 2009/0250722 A1 | 10/2009 | Bruce |
| 2009/0255567 A1 | 10/2009 | Frolov |
| 2009/0308437 A1 | 12/2009 | Woods |
| 2010/0005712 A1 | 1/2010 | Roccaforte |
| 2010/0015753 A1 | 1/2010 | Garnett |
| 2010/0024876 A1 | 2/2010 | McClary et al. |
| 2010/0059101 A1 | 3/2010 | Shinohara |
| 2010/0084924 A1 | 4/2010 | Frolov |
| 2010/0089441 A1 | 4/2010 | Frolov |

(56) References Cited

U.S. PATENT DOCUMENTS

| | | |
|---|---|---|
| 2010/0098854 A1 | 4/2010 | Bruce |
| 2010/0129957 A1 | 5/2010 | Frolov |
| 2010/0154327 A1 | 6/2010 | Reyal |
| 2010/0170556 A1 | 7/2010 | Frolov |
| 2010/0212714 A1 | 8/2010 | Rothschild |
| 2010/0229923 A1 | 9/2010 | Frolov |
| 2010/0233843 A1 | 9/2010 | Frolov |
| 2010/0241375 A1 | 9/2010 | Kumar |
| 2010/0288335 A1 | 11/2010 | Frolov |
| 2010/0294346 A1 | 11/2010 | Frolov |
| 2010/0294354 A1 | 11/2010 | Frolov |
| 2010/0314238 A1 | 12/2010 | Frolov |
| 2011/0024724 A1 | 2/2011 | Frolov |
| 2011/0067757 A1 | 3/2011 | Frantz |
| 2011/0095888 A1 | 4/2011 | Saluccio |
| 2011/0100447 A1 | 5/2011 | Korevaar |
| 2011/0143489 A1 | 6/2011 | Korevaar |
| 2011/0174366 A1 | 7/2011 | Frolov |
| 2012/0000513 A1 | 1/2012 | Ben Izhak |
| 2012/0019074 A1 | 1/2012 | Frolov |
| 2012/0027924 A1 | 2/2012 | Castellano |
| 2012/0060923 A1 | 3/2012 | Zhao |
| 2012/0097222 A1 | 4/2012 | Gessert |
| 2012/0145240 A1 | 6/2012 | Carcia |
| 2012/0153341 A1 | 6/2012 | Vasko |
| 2012/0180854 A1 | 7/2012 | Bellanger et al. |
| 2012/0233940 A1 | 9/2012 | Perkins |
| 2013/0000693 A1 | 1/2013 | Waterhouse |
| 2013/0068287 A1 | 3/2013 | Compaan |
| 2013/0074921 A1 | 3/2013 | Tang et al. |
| 2013/0133731 A1 | 5/2013 | Feldman-Peabody et al. |
| 2013/0174895 A1 | 7/2013 | Compaan |
| 2013/0206217 A1 | 8/2013 | Liu |
| 2013/0206219 A1 | 8/2013 | Kurtin et al. |
| 2013/0230944 A1 | 9/2013 | Feldman-Peabody |
| 2014/0000690 A1 | 1/2014 | Plotnikov |
| 2014/0000692 A1 | 1/2014 | Fogel |
| 2014/0113156 A1 | 4/2014 | Jonczyk |
| 2014/0196761 A1 | 7/2014 | Tilley |
| 2014/0209149 A1 | 7/2014 | Mascarenhas |
| 2014/0216534 A1 | 8/2014 | Hong |
| 2014/0216542 A1 | 8/2014 | Shao |
| 2014/0216550 A1 | 8/2014 | Damjanovic |
| 2014/0261692 A1 | 9/2014 | Irwin |
| 2014/0264988 A1 | 9/2014 | Bekele |
| 2014/0275552 A1 | 9/2014 | Irwin |
| 2014/0275602 A1 | 9/2014 | Irwin |
| 2014/0284750 A1 | 9/2014 | Yu |
| 2014/0302178 A1 | 10/2014 | Polansky |
| 2014/0333291 A1 | 11/2014 | Willis |
| 2014/0360576 A1 | 12/2014 | Plotnikov |
| 2015/0097071 A1 | 4/2015 | Frolov |
| 2015/0097079 A1 | 4/2015 | Frolov |
| 2015/0122947 A1 | 5/2015 | Bruce |
| 2015/0144186 A1 | 5/2015 | Gessert |
| 2015/0171260 A1 | 6/2015 | Liu |
| 2015/0207011 A1 | 7/2015 | Garnett et al. |
| 2015/0221790 A1 | 8/2015 | Heben |
| 2015/0249172 A1 | 9/2015 | Irwin |
| 2015/0280644 A1 | 10/2015 | Gostein |
| 2015/0287872 A1 | 10/2015 | Cauffiel |
| 2015/0364301 A1 | 12/2015 | Yamaguchi et al. |
| 2016/0060468 A1 | 3/2016 | Kim |
| 2016/0118934 A1 | 4/2016 | Johnson |
| 2016/0126395 A1 | 5/2016 | Damjanovic |
| 2016/0126396 A1 | 5/2016 | Damjanovic et al. |
| 2016/0126397 A1 | 5/2016 | Yu |
| 2016/0240796 A1 | 8/2016 | Irwin |
| 2016/0344330 A1 | 11/2016 | Gillis |
| 2016/0363938 A1 | 12/2016 | Frolov |
| 2017/0040933 A1 | 2/2017 | Vogel |
| 2017/0094142 A1 | 3/2017 | Irwin |
| 2017/0125625 A1 | 5/2017 | Cauffiel |
| 2017/0170353 A1 | 6/2017 | Jin et al. |
| 2018/0001975 A1 | 1/2018 | Jaramillo |
| 2018/0054156 A1 | 2/2018 | Lokey |
| 2018/0076764 A1 | 3/2018 | Irwin |
| 2018/0083151 A1 | 3/2018 | Shibasaki et al. |
| 2018/0248052 A1 | 8/2018 | Seok et al. |
| 2018/0254741 A1 | 9/2018 | Jones |
| 2018/0301288 A1 | 10/2018 | Irwin |
| 2018/0302021 A1 | 10/2018 | Hall |
| 2018/0317289 A1 | 11/2018 | Frolov |
| 2019/0018793 A1 | 1/2019 | Tarin |
| 2019/0115974 A1 | 4/2019 | Frolov |
| 2019/0181793 A1 | 6/2019 | Azad |
| 2019/0296174 A1 | 9/2019 | Gloeckler |
| 2019/0305166 A1 | 10/2019 | Compaan |
| 2019/0341506 A1 | 11/2019 | Sampath et al. |
| 2019/0393828 A1 | 12/2019 | Huuhtanen |
| 2020/0052643 A1 | 2/2020 | Ballentine |
| 2020/0106518 A1 | 4/2020 | Frolov |
| 2020/0157125 A1 | 5/2020 | Irwin |
| 2020/0206771 A1 | 7/2020 | deVos |
| 2020/0332408 A1 | 10/2020 | Irwin |
| 2021/0006201 A1 | 1/2021 | Hinson |
| 2021/0143350 A1 | 5/2021 | Irwin |
| 2021/0211095 A1 | 7/2021 | Xu |
| 2022/0069151 A1 | 3/2022 | Powell et al. |
| 2022/0085226 A1 | 3/2022 | Okumura |
| 2022/0407455 A1 | 12/2022 | Conti et al. |
| 2023/0317870 A1 | 10/2023 | Peng et al. |
| 2024/0421757 A1 | 12/2024 | Conti et al. |
| 2025/0154655 A1* | 5/2025 | Rojek ............... C23C 16/46 |
| 2025/0155291 A1* | 5/2025 | Heydhausen ......... G01J 5/0007 |

FOREIGN PATENT DOCUMENTS

| | | |
|---|---|---|
| CN | 102392282 | 2/2014 |
| CN | 107341566 | 11/2017 |
| CN | 108172645 | 6/2018 |
| CN | 109037390 | 12/2018 |
| CN | 111341859 | 6/2020 |
| DE | 102011087672 | 8/2012 |
| DE | 102011089916 | 6/2013 |
| EP | 3923468 | 12/2021 |
| JP | H09237907 | 9/1997 |
| JP | 7456053 | 3/2024 |
| KR | 20110003802 | 1/2011 |
| KR | 101067295 | 9/2011 |
| KR | 101971398 | 4/2019 |
| WO | 2007129097 | 11/2007 |
| WO | 2009105683 | 8/2009 |
| WO | 2011035234 | 3/2011 |
| WO | 2011142804 | 11/2011 |
| WO | 2012130070 | 10/2012 |
| WO | 2013009857 | 1/2013 |
| WO | 2014028526 | 2/2014 |
| WO | 2015126918 | 8/2015 |
| WO | 2017081477 | 5/2017 |
| WO | 2018071509 | 4/2018 |
| WO | 2018085829 | 5/2018 |
| WO | 2019085541 | 5/2019 |
| WO | 2020065060 | 4/2020 |
| WO | 2020246074 | 12/2020 |

OTHER PUBLICATIONS

Bastola et al., "Cadmium Selenide (CdSe) as an Active Absorber Layer for Solar Cells with Voc Approaching 750 mV," 2023 IEEE 50th Photovoltaic Specialists Conference (PVSC), San Juan, PR, USA, 2023, pp. 1-6 (2023).

Bauwens et al., "NMOS-Based Integrated Modular Bypass for Use in Solar Systems (NIMBUS): Intelligent Bypass for Reducing Partial Shading Power Loss in Solar Panel Application" Energies 9, No. 6: 450 (2016).

CdTe Optical Properties, refractiveindex.info database, Available at: refractiveindex.info/database/data-nk/main/CdTe/Treharne.yml (Last Visited: Nov. 21, 2024).

Chaik et al., "Analysis of the electrical impedance spectroscopy measurements of ZnTe:Ni thin film deposited by R-F sputtering," vol. 137, Jan. 2020, pp. 1-8.

(56) References Cited

OTHER PUBLICATIONS

Comprehensive Guide on Organic and Inorganic Solar Cells, Fundamental Concepts to Fabrication Methods, 1st Edition (Nov. 16, 2021).
Duenow et al., Comparison of Transparent Back Contacts for CdTe Top Cells in Tandem Thin-Film Photovoltaic Devices, 2009, 002443-002447.
Extended European Search Report dated Nov. 20, 2024 for European Patent Application No. 22861935.9.
Faulkner, "Variation of ZnTe:Cu Sputtering Target Preparation And Impacts On Film Properties and CdS/CdTe Solar Cell Performance," (2016).
Gessert, "A Fundamental Study of the Electrical and Optical Properties of Thin-Film, r.f.—Sputter-Deposited, Cu-Doped ZnTe" (1996).
Hall et al., Back contact materials used in thin fil CdTe solar cells—A review. Energy Sci Eng. 2021; 9: 606-632 (2021).
Hossain et al., "Tuning the bandgap of Cd1-xZnxS (x=0~1) buffer layer and CIGS absorber layer for obtaining high efficiency," Superlattices and Microstructures, vol. 161, (2022).
International Preliminary Report on Patentability Chapter II dated Jan. 23, 2024 for PCT International Application No. PCT/US2022/041026.
International Preliminary Report on Patentability received in related international application No. PCT/US2022/033659, mailed Jul. 25, 2023, 35 pages.
International Preliminary Report on Patentability received in related international application No. PCT/US2022/033612, mailed Aug. 18, 2023, 7 pages.
International Preliminary Report on Patentability received in related international application No. PCT/US2022/033603, mailed Oct. 11, 2023, 8 pages.
International Search Report and Written Opinion for Application No. PCT/US2022/033612 dated Sep. 23, 2022.
International Search Report and Written Opinion for Application No. PCT/US2022/033603 dated Sep. 28, 2022.
International Search Report and Written Opinion for Application No. PCT/US2022/033659 dated Oct. 5, 2022.
International Search Report and Written Opinion mailed on Feb. 16, 2023 for PCT International Application No. PCT/US2022/041026.
Japanese Office Action issued on Jul. 23, 2024 for Japanese Patent Application No. 2023-577929.
Ju et al., Thickness dependence study of inorganic CdTe/CdSe solar cells fabricated from colloidal nanoparticle solutions, (May 15, 2010).
Kapadnis et al., Cadmium telluride/cadmium sulfide thin films solar cells: a review, (Sep. 30, 2020).
Liu et al., High-Efficiency Isolated Photovoltaic Microinverter Using Wide-Band Gap Switches for Standalone and Grid-Tied Applications: Energies 11, No. 3: 569 (2018).
Liu et al., Solution processed CdTe/CdSe nanocrystal solar cells with more than 5.5% efficiency by using an inverted device structure, (Mar. 10, 2015).
Materials for Solar Energy Conversion: Materials, Methods and Applications, R. Rajasekar (Editor), C. Moganapriya (Editor), A. Mohankumar (Editor), ISBN: 978-1-119-75060-4 (Nov. 2021).
Mccandless et al., "Cd1-xZnxTe Solar Cells with 1.6 eV Band Gap" (2005).
Non-Final Office Action for U.S. Appl. No. 17/841,239 dated Aug. 16, 2023.
Non-Final Office Action for U.S. Appl. No. 17/841,218 dated Feb. 16, 2023.
NREL, "News Release: NREL Awards $2 Million in Contracts To Support Development of Cheaper, More Efficient Cadmium Telluride Solar Cells," (Jun. 22, 2023).
NREL, Grid Modernization, "Reference Air Mass 1.5 Spectra," *Reference Air Mass 1.5 Spectra | Grid Modernization | NREL*, Available at: *Reference Air Mass 1.5 Spectra | Grid Modernization | NREL* (Jan. 26, 2021).
Prism Solar Data Sheet, BN72 Bifacial Modules, 72—Cell Bifacial Series BN72—370, Available at"https"//static1.squarespace.com/static/57a12f572968714a21ab938d/t/5e509ebbdbfcb2688ef27902/1582341820082/Prism+Solar+-+BN72+-+Gen2+-+360-370W+-+v1.2pdf (2020).
Samoilenko, "Development of Ii-Vi Ternary Alloys For CDTE-Based Solar Cells" (2020).
Sharma et al., "CdZnTe thin films as proficient absorber layer candidates in solar cell devices: a review" (2023).
Sharma et al., "Review on bandgap engineering in metal-chalcogenide absorber layer via grading: A trend in thin-film solar cells," Solar Energy, vol. 246, pp. 152-180 (2022).
Spanias Andreas S: "Solar energy management as an Internet of Things (IoT) aookucatuib", 2017 8th International Conference on Information, Intelligence, Systems & Application (IISA), IEEE, Aug. 27, 2017 (Aug. 27, 2017), pp. 1-4, xp033331189, doi: 1109/iisa.2017.831640 [Retrieved On Mar. 14, 2018] p. 1, right-hand column, p. 1, right hand column, paragraph 4—p. 3, left-hand column, paragraph 1; figures 2, 4.
Streetman et al., "Solid State Electronic Devices," Solid State Electronic Devices, $6^{th}$ Edition (Aug. 5, 2005).
Streetman, Solid State Electronic Devices. Third Edition. (Prentice Hall series in solid state physical electronics), $3^{rd}$ Edition, pp. 144-148 (1990).
Subedi et al., "Enabling bifacial thin film devices by developing a back surface field using CuxAlOy". United States (2021).
Subedi et al., "Nanocomposite (CuS)x(ZnS)1-x Thin Film Back Contact for CdTe Solar Cell: Toward a Bifacial Device," (2018).
Sven Rühle, "Tabulated values of the Shockley-Queisser limit for single junction solar cells," Solar Energy, vol. 130, 2016, pp. 139-147, ISSN 0038-092X, https://doi.org/10.1016/j.solener.2016.02.015. (https://www.sciencedirect.com/science/article/pii/S0038092X16001110).
Sze, "Physics of Semiconductor Devices," Second Edition, pp. 74-84 (1981).
Treharne et al., "Optical Design and Fabrication of Fully Sputtered CdTe/CdS Solar Cells," Journal of Physics: Conference Series, vol. 286 (2011).
U.S. Department of Energy, EERE Funding Opportunity Exchange, "DE-FOA-0003058: Advancing U.S. Thin-Film Solar Photovoltaics," (2023).
United States Office Action issued on Aug. 22, 2024 for U.S. Appl. No. 17/841,442.
United States Office Action issued on Aug. 26, 2024 for U.S. Appl. No. 18/615,162.
United States Office Action issued on May 29, 2024 for U.S. Appl. No. 18/615,162.
Vieira et al. "A Comprehensive Review on Bypass Diode Application on Photovoltaic Modules" Energies 13, No. 10: 2472 (2020).
Xue et al., Recent progress on solution-processed CdTe nanocrystals solar cells, (Jul. 4, 2016).
Yakubovsky et al., Ultrathin and Ultrasmooth Gold Films on Monolayer $MoS_2$. *Adv. Mater. Interfaces* 2019, 6, 1900196. https://doi.org/10.1002/admi.201900196.

\* cited by examiner

OPTIMIZING CADMIUM (Cd) ALLOY SOLAR CELLS WITH SPUTTERED COPPER-DOPED ZINC TELLURIDE (ZnTe:Cu) BACK CONTACTS IN THE PRESENCE OF HYDROGEN

CROSS-REFERENCE TO RELATED APPLICATIONS

This application is a divisional of U.S. application Ser. No. 19/009,396, filed on Jan. 3, 2025, the contents of which are hereby incorporated by reference in their entirety.

FIELD OF INVENTION

The disclosure herein is related to manufacturing transmissive solar cells.

BACKGROUND

Hydrogen (H) is a chemical element that, at standard conditions, is a gas of diatomic molecules with the formula $H_2$ and called hydrogen gas, molecular hydrogen, or dihydrogen. Argon (Ar) is a chemical element that, at standard conditions, is stable gas of one atom and called argon gas. Oxygen (O) is a chemical element that, at standard conditions, is a gas of diatomic molecules with the formula $O_2$ and called oxygen gas or dioxygen. Sputtering, generally, is an atomic/microscopic deposition of particles of a target material onto a surface of a substrate within a vacuum chamber containing a gas, such as argon gas (Ar). More particularly, conventional sputtering techniques are used to make extremely fine uniform layers of the target material (i.e., thin films) on the surface.

Research and scholarship regarding the effects of the presence of hydrogen gas ($H_2$) during sputtering of thin films in a vacuum chamber that includes argon gas (Ar) are minimal.

Particularly, the effects of hydrogen gas ($H_2$) on sputter deposited copper-doped zinc telluride (ZnTe:Cu) thin films was first explored at the National Renewable Energy Laboratory (NREL) in 1996 (see Gessert, Timothy A., A Fundamental Study of the Electrical and Optical Properties of Thin-Film, r.f.-Sputter-Deposited, Cu-Doped ZnTe (1996), herein referred to as "Thesis 1996"). Thesis 1996 shows that a resistivity of a film increased to an extent that the resistivity was unmeasurable, that no measurable changes in tellurium (Te), zinc (Zn) or copper (Cu) composition were found, and that a film transmissivity increased due to an increase in a bandgap for three concentrations of $H_2$ (i.e., 1.28% hydrogen gas ($H_2$), 0.2% hydrogen gas ($H_2$) and 0.1% hydrogen gas ($H_2$) in an argon gas (Ar)). (Thesis 1996 at pp. 80, PDF 87). Thesis 1996 provided no definitive explanation as to the increase in the bandgap for the sputter deposited copper-doped zinc telluride (ZnTe:Cu) thin films. Thesis 1996 theorized that hydrogen gas ($H_2$) may have ionized and incorporated into the zinc telluride (ZnTe) lattice as a hydrogen-telluride (H—Te) bond. (Thesis 1996 at pp. 81, PDF 89). Thesis 1996 also theorized that the hydrogen gas ($H_2$) may have reacted with residual oxygen gas ($O_2$) in a vacuum chamber (i.e., creating a reducing environment) thereby reducing residual oxygen in the copper-doped zinc telluride (ZnTe:Cu) thin film. (Thesis 1996 at pp. 83, PDF 90). While Thesis 1996 showed positive changes in optical properties (i.e., increased film transmissivity), Thesis 1996 also indicated unfavorable changes in the electrical properties (i.e., increased film resistivity). Accordingly, because Thesis 1996 is limited to the study of thin films and teaches away from any application of creating electrical devices due to the unfavorable changes in the electrical properties, Thesis 1996 is not applicable to the different and more complex field of manufacturing transmissive solar cells (due in part to unexpected problems arising in the manufacturing transmissive solar cells that are not contemplated by the simpler study of thin films).

In 2016, the effects of hydrogen gas ($H_2$) on sputter deposited copper-doped zinc telluride (ZnTe:Cu) thin films was again explored. (see Faulkner, Brooke R., Variation of ZnTe:Cu Sputtering Target Preparation And Impacts On Film Properties and CdS/CdTe Solar Cell Performance (2016), herein referred to as "Faulkner 2016"). Faulkner 2016 shows a series of experiments that are similar to Thesis 1996 for sputter deposited copper-doped zinc telluride (ZnTe:Cu) thin films in concentrations of hydrogen gas ($H_2$) in an argon gas (Ar) (i.e., 6.07% hydrogen gas ($H_2$), 1.28% hydrogen gas ($H_2$) and 0.77% hydrogen gas ($H_2$)). (Faulkner 2016 at pp. 53, PDF 65). Faulkner 2016 shows that the bandgap increases as the hydrogen gas ($H_2$) is added to the argon gas (Ar), which confirmed the results of Thesis 1996. (Faulkner 2016 at pp. 57. PDF 69). Faulkner 2016 theorizes that the hydrogen gas ($H_2$) reduces the residual oxygen gas ($O_2$) content in the copper-doped zinc telluride (ZnTe:Cu) thin film. Faulkner 2016 further presented results with no measurable oxygen gas ($O_2$) in the argon gas (Ar) with the hydrogen gas ($H_2$), which indicates that "other factors" (e.g., temperature of a substrate) may be contributing to the residual oxygen gas ($O_2$) concentration. (Faulkner 2016 at pp. 55, PDF 67). Additionally, while Faulkner 2016 goes on to analyze the impact of the other factors on copper-doped zinc telluride (ZnTe:Cu), the analysis of Faulkner 2016 is limited to the research of the other factors as isolated parameters (e.g. temperature of a substrate without hydrogen gas ($H_2$) variances in the argon gas (Ar)). Accordingly, because Faulkner 2016 is limited to the study of optical and structural properties of copper-doped zinc telluride (ZnTe:Cu) thin films and because Faulkner 2016 also indicates that hydrogen gas ($H_2$) may have a negative impact on electrical properties of copper-doped zinc telluride (ZnTe:Cu) thin films (and thus would not be a good optimization for a CdTe solar cell back contact), Faulkner 2016 is also not applicable to the different and more complex field of manufacturing transmissive solar cells.

Research and scholarship regarding the use of copper-doped zinc telluride (ZnTe:Cu) as a back contact for traditional cadmium telluride (CdTe) solar cell exists. However, because traditional cadmium telluride (CdTe) solar cells are three (3) microns (µm) to six (6) microns (µm) thick and inherently opaque, the research and scholarship regarding the use of copper-doped zinc telluride (ZnTe:Cu) as the back contact for traditional cadmium telluride (CdTe) solar cells has focused on electrical and mechanical properties of cadmium telluride (CdTe), copper-doped zinc telluride (ZnTe:Cu), and other sections of the traditional cadmium telluride (CdTe) solar cells.

Research and scholarship regarding the alternative fields of bifacial, tandems and transparent solar cells and optical properties thereof also exists. However, because this research and scholarship is centered on optical analysis and optimization of individual layers and materials of these solar cells without contemplation of electrical and mechanical properties, these alternative fields when applied to transmissive solar cells provide inconclusive data, unrelated teachings, and/or features that would destroy a function thereof. For example, optimization of the optical properties (which typically starts by reducing thickness, but is also greatly influenced by dopants, temperature, and crystal structure) comes at reduction of the electrical properties, leading to the incorrect conclusion that the optimization of one must come at the sacrifice of the other.

Accordingly, because research and scholarship regarding traditional cadmium telluride (CdTe) solar cells and the alternative fields of bifacial, tandems and transparent solar cells is incongruent with transmissive solar cells, research and scholarship regarding traditional cadmium telluride (CdTe) solar cells and the alternative fields of bifacial, tandems and transparent solar cells are also not applicable to the different and complex field of manufacturing transmissive solar cells.

There is a need for transmissive solar cells that provide a commercially viable photo electric performance. In turn, there is a need for optimization methods in manufacturing transmissive solar cells that contemplate bandgap, layer thickness, transmissivity, composition, and other properties, or any combination thereof, to arrive at commercially viable photo electric performance.

SUMMARY

According to one or more embodiments, a method for manufacturing transmissive solar cells is provided.

According to one or more embodiments, a method of manufacturing a cadmium (Cd) alloy transmissive solar cell is provided. The method includes pumping a vacuum chamber to a base pressure and admitting gas into the vacuum chamber to raise the base pressure to a sputtering pressure. The method includes providing into the vacuum chamber a first gas at a rate that balances a flow of the first gas in and out of the vacuum chamber with respect to the sputtering pressure. The method includes heating a surface of a partially manufactured cadmium (Cd) alloy transmissive solar cell within the vacuum chamber to a calibrated deposition temperature. The method includes providing into the vacuum chamber a second gas including at least a hydrogen gas ($H_2$) at a proportional rate to achieve a target gas mix while maintaining the sputtering pressure. The method includes depositing a target material onto the surface to form a back contact section of the cadmium (Cd) alloy transmissive solar cell.

According to one or more embodiments, a method of calibrating a deposition device to generate a plurality of time and temperature offsets is provided. The method includes setting a substrate holder system of the deposition device to a first set point temperature and continuously detecting a surface temperature on the glass surface until a normalization. The method includes recording a time and a surface temperature offset at the normalization. The method includes repeatedly incrementing the first set point temperature to a next set point temperature, detecting a next surface temperature at a next normalization respective to the next set point temperature, and recording a next time and a next surface temperature offset respective to the next set point temperature until the substrate holder system is set to a last set point temperature. The method includes generate the plurality of time and temperature offsets for the deposition device from each recording at each increment from the first set point temperature to the last set point temperature.

According to one or more embodiments, any of the methods described herein can be implemented in devices, apparatuses, and systems, and with respect to one or more related methods.

BRIEF DESCRIPTION OF THE DRAWINGS

A more detailed understanding may be had from the following description, given by way of example in conjunction with the accompanying drawings, wherein like reference numerals in the figures indicate like elements, and wherein.

DETAILED DESCRIPTION

Figure 1:
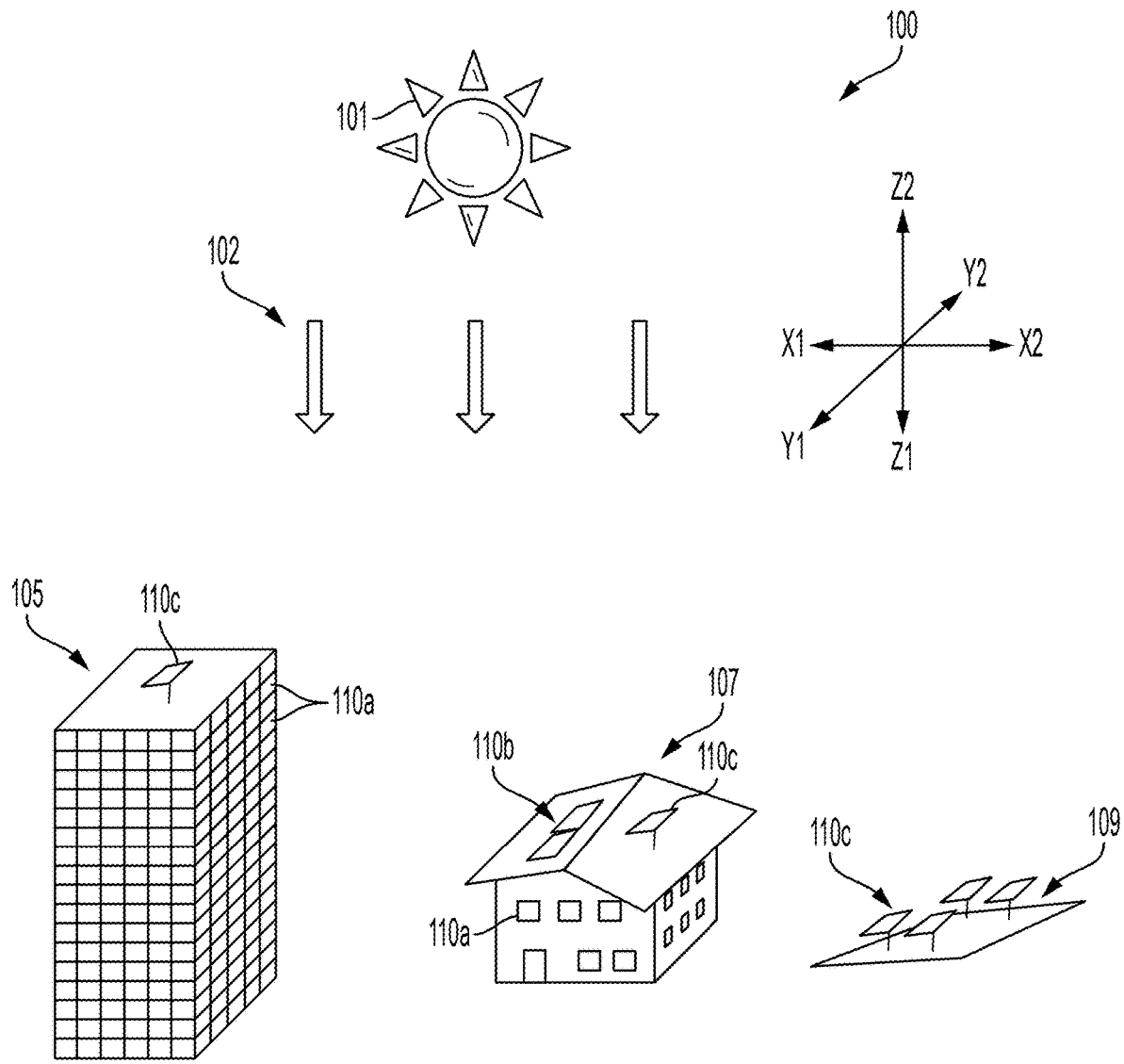
FIG. 1 depicts an environment according to one or more embodiments.

The disclosure herein relates to transmissive solar cells implemented in modules, devices, systems, windows, skylights, and buildings that provide commercially viable photo electric performances while having optimized properties. Thus, the disclosure herein relates to optimization methods in manufacturing these transmissive solar cells that contemplate bandgap, layer thickness, transmissivity, composition, and other properties, or any combination thereof, to arrive at the commercially viable photo electric performances.

According to one or more embodiments, an optimization method for depositing copper-doped zinc telluride (ZnTe: Cu) as a back contact for a cadmium (Cd) alloy transmissive alloy solar cell with a hydrogen concentration present in a deposition environment is provided. The deposition environment, generally, is a vacuum including argon gas (Ar). The hydrogen concentration include hydrogen gas ($H_2$) at or between 0.01% to 0.10%, which is added to the deposition environment (i.e., the argon gas (Ar)) in contemplation of manufacturing the cadmium (Cd) alloy transmissive alloy solar cell. Thus, the optimization method includes the use of hydrogen gas ($H_2$) during the deposition of the copper-doped zinc telluride (ZnTe:Cu) back contact on the cadmium (Cd) alloy transmissive alloy solar cell, in combination with changes with other deposition parameters to achieve both an increase in electrical properties and optical properties of the cadmium (Cd) alloy transmissive alloy solar cell.

According to one or more embodiments, the optimization method creates a balanced optical and electrical cadmium (Cd) alloy transmissive alloy solar cell. That is, because the work of Thesis 1996 and Faulkner 2016 are limited in field and disclosure as discussed herein, the optimization method provides a mechanism to enhance both the optical and electrical properties of a copper-doped zinc telluride (ZnTe: Cu) back contact through incorporating hydrogen gas ($H_2$) in argon gas (Ar). As discussed herein, different thicknesses of materials can be deposited for electrical and optical measurements. Thicker materials render better electrical measurements, however, due to the thickness, the thicker materials becomes inherently opaque and yields no optical measurements. Conversely, thinner material can provide optical measurements, yet yield no electrical measurements (i.e., too thin). Thus, because properly characterizing optical and electrical properties is extremely difficult, the optimization method focuses on an entirety of the cadmium (Cd) alloy transmissive alloy solar cell (not just one section) as well as electrical performance of the entire cadmium (Cd) alloy transmissive alloy solar cell (not just one section). Accordingly, the cadmium (Cd) alloy transmissive alloy solar cell and the optimization method herein provide a designed, deposited, and tested solar cell that is unrelated to simple single thin film scholarship and providing experimental results going well beyond any traditional/conventional technologies.

Turning to FIG. 1, an environment 100 is provided according to one or more embodiments. The environment 100 of FIG. 1 is shown oriented according to an X1-X2 axis, a Z1-Z2 axis, and a Y1-Y2 axis. The X1-X2 axis is generally horizontal as oriented in the Figures, with the X1-X2 axis having a direction between left (X1) and right (X2). Accordingly, the X1 direction is opposite the X2 direction, reference to a left side or left facing surface of a component may be referred to as an X1 side or an X1 surface of the component, and reference to a right side or right facing surface of a component may be referred to as an X2 side or an X2 surface of the component. The Z1-Z2 axis is generally vertical as oriented in the Figures, with the axis having a direction between down (Z1) and up (Z2). Accordingly, the Z1 direction is opposite the Z2 direction, reference to a lower or bottom side or a downwardly facing surface of a component may be referred to as a Z1 side or a Z1 surface, and reference to a top or upper side or upwardly facing surface of a component may be referred to as a Z2 side or a Z2 surface. Other orientations (e.g., tilted or angled orientations) can be made in accordance with the X1-X2 axis and Z1-Z2 axis. The Y1-Y2 axis is generally orthogonal to the X1-X2 axis and the Z1-Z2 axis and having a direction between forward (Y1) and back (Y2), though the Y1-Y2 is not shown orthogonal to the page of FIG. 1. Accordingly, the Y1 direction is opposite the Y2 direction, reference to a forward side or forward facing surface of a component may be referred to as an Y1 side or an Y1 surface of the component, and reference to a back side or back facing surface of a component may be referred to as an Y2 side or an Y2 surface of the component.

The environment 100 includes the sun 101 providing light energy or light 102 (e.g., from the Z2 direction). The sun 101 is representative of all light sources. The light 102 can be considered incident light or natural light, and the light 102 can represent light from sources other than the sun 102. The light 102 can range across a light spectrum including, but not limited to, ultraviolet (UV) light, visible light, and infrared light.

The environment 100 includes one or more sites, as represented by a building 105 (e.g., a skyscraper), a residence 107 (e.g., a house), and a surface area 109 (e.g., a field, a body of water, etc.). By way of example, the environment 100 and the one or more sites can include aquaculture areas (e.g., lake or pond where light transmission is beneficial to the water), agriculture areas (e.g., field or farm where light transmission is beneficial to the land), temporary structures (e.g., military forward medical units), structures needing power and daylight (e.g., remote machine sheds, electrical relay stations, pump stations, water monitoring, etc.), etc. Configured at the one or more sites are one or more solar devices 110 (e.g., high efficiency, bandgap, ultra-thin photovoltaic devices) that include one or more bandgap cadmium (Cd) alloy solar cells particularly designed to optimize a cadmium (Cd) bandgap and configure a transmissivity through composition, layer thickness, or both while maintaining commercially viable electrical performance, as described herein. That is, the one or more solar devices 110 have a power conversion efficiency (PCE) that provides commercially viable electrical performance. PCE, generally, is a measurement in percentage of an energy converted from the light 102 to electricity (e.g., a ratio of electrical power produced by a cell of the device 110 to the light 102 received).

As shown in FIG. 1, the one or more solar devices 110 can be implemented as building panels 110a, roof panels 110b, and/or racked panels 110c. According to one or more embodiments, the building panels 110a or the roof panels 110b can include solar devices 110 for use in independent or in mechanical stacking configurations for use in commercial and residential applications. According to one or more embodiments, the racked panels 110c can include solar devices 110 for use in independent or in mechanical stacking configurations for use in power plant applications. One or more technical effects, benefits, and advantages of the one or more solar devices 110 include balancing composition, thickness, and transmissivity, as well as maintaining/improving the total PCE and adding/improving anti-reflective coatings, in contemplation of the building panels 110a, the roof panels 110b, and the racked panels 110c of the commercial, residential, and applications of FIG. 1.

Figure 2:
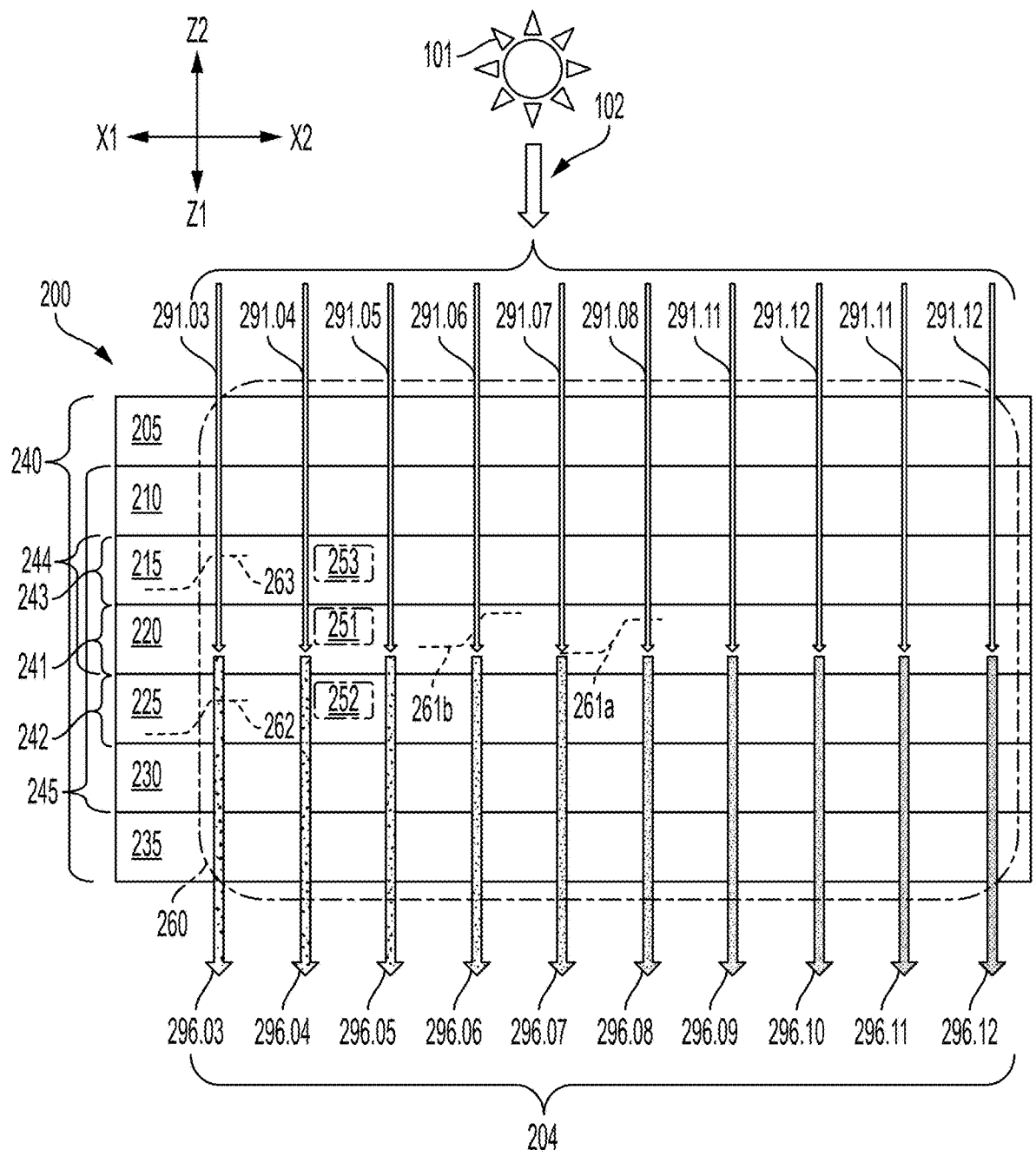
FIG. 2 depicts a transmissive cadmium (Cd) alloy solar cell according to one or more embodiments.

Turning to FIG. 2, a transmissive cadmium (Cd) alloy solar cell 200 is provided according to one or more embodiments. For ease of explanation, items and elements of the that are similar to previous Figures are reused and not reintroduced. The transmissive cadmium (Cd) alloy solar cell 200 can be representative of an example of single cell of a module including a plurality of transmissive cadmium (Cd) alloy solar cells 200. Further, the transmissive cadmium (Cd) alloy solar cell 200 can be representative a cell of mechanically stacked solar modules within one or more apparatuses, devices, or systems. The transmissive cadmium (Cd) alloy solar cell 200 includes a ten percent (10%) or greater PCE, which can add to a total PCE of a mechanically stacked solar apparatus, device, or system. According to one or more embodiments, the transmissive cadmium (Cd) alloy solar cell 200 includes a fifteen percent (15%) or greater PCE, which can add to a total PCE of a mechanically stacked solar apparatus, device, or system. Accordingly, embodiments of the transmissive cadmium (Cd) alloy solar cell 200 include apparatuses, systems, and/or methods at any possible technical detail level of integration.

The transmissive cadmium (Cd) alloy solar cell 200 of FIG. 2 is shown as a cross section oriented according to an X1-X2 axis and a Z1-Z2 axis. The X1-X2 axis is generally horizontal as oriented in the Figures, with the X1-X2 axis having a direction between left (X1) and right (X2). Accordingly, the X1 direction is opposite the X2 direction, reference to a left side or left facing surface of a component may be referred to as an X1 side or an X1 surface of the component, and reference to a right side or right facing surface of a component may be referred to as an X2 side or an X2 surface of the component. The Z1-Z2 axis is generally vertical as oriented in the Figures, with the axis having a direction between down (Z1) and up (Z2). Accordingly, the Z1 direction is opposite the Z2 direction, reference to a lower or bottom side or a downwardly facing surface of a component may be referred to as a Z1 side or a Z1 surface, and reference to a top or upper side or upwardly facing surface of a component may be referred to as a Z2 side or a Z2 surface. Other orientations (e.g., tilted or angled orientations) can be made in accordance with the X1-X2 axis and Z1-Z2 axis.

The transmissive cadmium (Cd) alloy solar cell 200 receives, from at least the sun 101 (e.g., from the Z2 direction and at a Z2 side of the transmissive cadmium (Cd) alloy solar cell 200), the light 102. The transmissive cadmium (Cd) alloy solar cell 200 absorbs and converts one or more portions of the light 102 into electricity and transmits one or more remaining portions out of a Z1 side (e.g., a side opposite the sun 101) of transmissive cadmium (Cd) alloy solar cell 200 and in the Z1 direction, as transmitted light 204. The transmitted light 204 ranges across the light spectrum. The transmitted light 204 is at a lower intensity than the light 102 due to the absorption and conversion of the one or more portions of the light 102 by the transmissive cadmium (Cd) alloy solar cell 200.

The transmissive cadmium (Cd) alloy solar cell 200 includes a first substrate section 205, a first conductive section 210, a first transmissive absorber section 215, and a second transmissive absorber section 220. The transmissive cadmium (Cd) alloy solar cell 200 can further include a back contact section 225, a second conductive section 230, and/or a second substrate section 235.

According to one or more embodiments, a Z2 side (e.g., the sun side) of the first substrate section 205 faces outward from the transmissive cadmium (Cd) alloy solar cell 200 and is exposed to the light 102, and a Z1 side (e.g., a side opposite the sun side) the first substrate section 205 faces inward (e.g., into to the transmissive cadmium (Cd) alloy solar cell 200). The Z1 side of the first substrate section 205 is adjacent to a Z2 side of the first conductive section 210. Adjacent in this context includes two sections being in contact and intimately bound. Adjacent can further include a blending of sections across the boundaries (such as a transfers of materials at an atomic level). A Z1 side of the first conductive section 210 is adjacent to a Z2 side of the first transmissive absorber section 215. A Z1 side of the first transmissive absorber section 215 is adjacent to a Z2 side of the second transmissive absorber section 220. A Z1 side of the second transmissive absorber section 220 is adjacent to a Z2 side of the back contact section 225. A Z1 side of the back contact section 225 is adjacent to a Z2 side of the second conductive section 230. A Z1 side of the second conductive section 230 is adjacent to a Z2 side of the second substrate section 235. A Z2 side (e.g., a sun side) the second substrate section 235 faces inward (e.g., into to the transmissive cadmium (Cd) alloy solar cell 200), and a Z1 side (e.g., a side opposite the sun side) of the second substrate section 235 faces outward from the transmissive cadmium (Cd) alloy solar cell 200.

Generally, the Z2 side of the first substrate section 205 receives the light 102. The light 102 passes through, in the Z1 direction, the first substrate section 205, the first conductive section 210, and into the first transmissive absorber section 215 and the second transmissive absorber section 220. The first transmissive absorber section 215 and the second transmissive absorber section 220 absorb (e.g., whether in combination or individually) one or more portions of the light 102 received from the first conductive section 210 and can transmit the one or more remaining portions, as the transmitted light 204, towards the back contact section 225 (e.g., out of the Z1 side of the second transmissive absorber section 220 in the Z1 direction). The transmitted light 204 passes through, in the Z1 direction, the back contact section 225, the second conductive section 230, and the second substrate section 235 and exits a Z1 side of the second substrate section 235.

The transmissive cadmium (Cd) alloy solar cell 200 as a whole, along with each individual section or groups of sections, can be described by one or more properties. The one or more properties include, but are not limited to, a composition, a thickness, a transmissivity, and/or a bandgap. For ease of explanation and brevity, FIG. 2 shows example representations of these one or more properties in a particular section or across a particular group of section (though properties for all sections and combination of sections are contemplated herein).

As shown in FIG. 2, the transmissive cadmium (Cd) alloy solar cell 200 can include a total thickness 240. The total thickness 240 can include at least a thickness 241 of the second transmissive absorber section 220, a thickness 242 of the back contact section 225, and a thickness 243 of the first transmissive absorber section 215. Further, the thickness 241 and thickness 243 can be combined to provide a thickness 244 of the second transmissive absorber section and the first transmissive absorber section 215. Furthermore, an internal thickness 245 can be a distance between the Z2 side of the first conductive section 210 and a Z1 side of the second conductive section 230.

As shown in FIG. 2, the second transmissive absorber section 220, the back contact section 225, and the first transmissive absorber section 215 of the transmissive cadmium (Cd) alloy solar cell 200 can include compositions 251, 252, and 253. Further, the second transmissive absorber section 220, the back contact section 225, and the first transmissive absorber section 215 of the transmissive cadmium (Cd) alloy solar cell 200 can include optimized bandgaps 261 (show as optimized bandgap 261a and optimized bandgap 261b), 262, and 263.

The first substrate section 205 can be any glass or plastic that is transmissive. According to one or more embodiments, the transmissive quality of the first substrate section 205 includes a high transmissivity that transmits the light spectrum. According to one or more embodiments, the first substrate section 205 can include a section thickness along a range from two (2) millimeters (mm) to four (4) millimeters (mm) (e.g., at approximately 3.2 mm). The first substrate section 205 can be also be conductive.

An example of the first substrate section 205 can include, but is not limited to, a fluorine-doped tin oxide (FTO) glass substrate. The FTO glass substrate is a transmissive (e.g., which includes being transparent) conductive substrate, distinctively coated with FTO to provide electrical conductivity. The FTO coating can be on the Z1 surface, the Z2 surface, or both of the first substrate section 205.

The first conductive section 210 can include a conductive glass, a conductive plastic, or other conductive material with a transmissive quality. The first conductive section 210 can include fluorine-doped tin oxide (FTO), indium-doped tin oxide (ITO), or sufficiently transparent and conductive layers oxide (e.g., a nanoparticle layer). According to one or more embodiments, the transmissive quality of the first conductive section 210 includes a transmissivity that transmits the light spectrum. The first conductive section 210 can be referred to as a transmissive conductive front contact or a front electrode. The substrate section 210 can be an n-type transparent material, for example, an ITO-coated glass or FTO-coated glass. The first conductive section 210 can include a section thickness along a range from two hundred (200) nanometers (nm) to six hundred (600) nanometers (nm) (e.g., at approximately 400 nm).

The first transmissive absorber section 215 includes one or more properties, such as the composition 253, the thickness 243, a transmissivity, and/or the optimized bandgap 263. The composition 253 of the first transmissive absorber section 215 can include a cadmium alloy and/or other transmissive absorber material. Examples of cadmium alloy include, but are not limited to, cadmium sulfide (CdS), cadmium selenide (CdSe), and cadmium telluride (CdTe), zinc telluride (ZnTe), and magnesium-doped zinc oxide (MZO). The first transmissive absorber section 215 can be an n-type semiconductor or a p-type semiconductor, or combination thereof. The composition 253 of the first transmissive absorber section 215 can be selected and configured in view of the description herein.

The thickness 243 of the first transmissive absorber section 215 can include a one hundred (100) or less nanometer (nm) section thickness. The thickness 243 of the first transmissive absorber section 215 can include a section thickness along a range from fifty (50) nanometers (nm) to one hundred fifty (150) nanometers (nm) (e.g., at approximately 200 nanometers (nm)). As shown in FIG. 2 optimized bandgap 263 of the first transmissive absorber section 215 can include be greater than 2.0 eV.

The second transmissive absorber section 220 is transmissive. The second transmissive absorber section 220 includes one or more properties, such as the composition 251, the thickness 241, a transmissivity, and/or the optimized bandgap 261. The composition 251 of the second transmissive absorber section 220 includes a cadmium alloy and/or other transmissive absorber material with an optimized bandgap (e.g., the optimized bandgap 261).

More particularly, the second transmissive absorber section 220 balances the composition 251, the thickness 241, and/or a transmissivity to provide the optimized bandgap 261 (i.e., a high bandgap). The composition 251 can correspond to the materials, material concentrations, bandgap, and other physical, electrical, and crystalline properties of the one or more sections of the one or more transmissive cadmium (Cd) alloy solar cells 200. Further, to design the optimized bandgap 261 for any irradiance wavelength ranges, the individual sections of the transmissive cadmium (Cd) alloy solar cell 200 can be configured with compositions that assist with, enhance, or do not interfere with achieving the optimized bandgap 261.

Examples of the composition 251 (e.g., cadmium alloys) include, but are not limited to, cadmium telluride (CdTe), cadmium selenide telluride (CdSeTe), and cadmium selenide (CdSe).

The composition 251 (e.g., of the second transmissive absorber section 220, as well as other sections of the transmissive cadmium (Cd) alloy solar cell 200) can include, but is not limited to, cadmium, zinc, selenium, tin, oxygen, copper, nitrogen, aluminum, carbon, gold, platinum, palladium, sulfur, and other additives. By further configuring the composition 251, the second transmissive absorber section 220 can be an n-type semiconductor, an i-type semiconductor, a p-type semiconductor, or combination thereof. According to one or more embodiments, the second transmissive absorber section 220 can have changing ratios n-type semiconductor, i-type semiconductor, and p-type semiconductor.

The second transmissive absorber section 220 includes the thickness 241 (e.g., a section thickness). The thickness 241 can be a width of the second transmissive absorber section 220 from the Z2 surface of the second transmissive absorber section 220 to the Z1 surface of the second transmissive absorber section 220. According to one or more embodiments, the thickness 241 can be at or less than seven hundred (700) nanometers (nm), for example, at or less than six hundred fifty (650) nanometer (nm) or at or less than five hundred (500) nanometers (nm). According to one or more embodiments, the thickness 241 can be along a range of one hundred (100) nanometers (nm) to seven hundred (700) nanometers (nm), for example, along a range from one hundred fifty (150) nanometers (nm) to six hundred fifty (650) nanometers (nm) (e.g., at approximately 500 nm, 300 nm, or 200 nm). The thickness 241 can be one hundred (100) nanometers (nm), one hundred fifty (150) nanometers (nm), two hundred (200) nanometers (nm), two hundred fifty (250) nanometers (nm), three hundred (300) nanometers (nm), three hundred fifty (350) nanometers (nm), four hundred (400) nanometers (nm), etc.

The composition 251 and the thickness 241 can contribute to a transmissivity 260 of the transmissive cadmium (Cd) alloy solar cell 200, but are not the only factors. The transmissivity 260 is an ability of the transmissive cadmium (Cd) alloy solar cell 200 to permit one or more portions of the light spectrum (e.g., irradiance of ultraviolet (UV) light, visible light, and infrared light) that is not absorbed to transmit therethrough. The transmissivity 260 of the transmissive cadmium (Cd) alloy solar cell 200 can be designed for portions of the light spectrum irrespective of the other portions.

According to one or more embodiments, the transmissivity 260 of the transmissive cadmium (Cd) alloy solar cell 200 includes at least ten percent (10%) transmissivity for one or more portions of a first irradiance wavelength range. The first irradiance wavelength range can include a wavelength range less than and equal or approximate to the wavelength of the optimized bandgap 261. The optimized bandgap 261 can be a slope, a curve, or other shape along a second irradiance wavelength. The second irradiance wavelength range can include a wavelength range equal or approximate to a beginning and end of an interior slope of the wavelength of the optimized bandgap 261. The transmissivity 260 of the transmissive cadmium (Cd) alloy solar cell 200 includes at least sixty-five percent (65%) transmissivity for one or more portions of a third irradiance wavelength range. The third irradiance wavelength range can include a wavelength range greater than and equal or approximate to the wavelength of the optimized bandgap 261. The first, second, and third irradiance wavelength ranges can overlap. According to one or more embodiments, the transmissivity 260 of the transmissive cadmium (Cd) alloy solar cell 200 includes at least fifteen percent (15%) or greater for the one or more portions of the first irradiance wavelength range and includes at least seventy percent (70%) or greater for the one or more portions of the third irradiance wavelength range.

Thus, a plurality of compositions of the transmissive cadmium (Cd) alloy solar cell 200 (e.g., the composition 251), a plurality of thicknesses of the sections (e.g., the thickness 241), and a plurality of thicknesses of groups of sections (e.g., a combined thickness 244 or an internal thickness 245) are contemplated by the transmissive cadmium (Cd) alloy solar cell 200 to achieve a high bandgap (e.g., the optimized bandgap 261) and relative transmissive qualities (e.g., the transmissivity 260) for the transmissive cadmium (Cd) alloy solar cell 200.

The combined thickness 244 can be an addition of section thicknesses for the first and second transmissive absorber sections 215 and 220. The combined thickness 244 can be a width from the Z2 surface of the first transmissive absorber section 215 to the Z1 surface of the second transmissive absorber section 220. According to one or more embodiments, the combined thickness 244 can be at or less than one thousand (1000) nanometers (nm), for example, at or less than seven hundred fifty (750) nanometer (nm).

The internal thickness 245 can be a width from the Z2 surface of the first conductive section 210 to the Z1 surface of the second conductive section 230. According to one or more embodiments, the total thickness can be less than two thousand (2,000) nanometers (nm), for example, along a range of five hundred (500) nanometers (nm) to one thousand five hundred (1,500) nanometers (nm).

The back contact section 225 is transmissive. The back contact section 225 includes one or more properties, such as the composition 252, the thickness 242, a transmissivity, and/or the optimized bandgap 262. The composition 252 of the back contact section 225 can include can include one or more conductors. The composition 252 of the back contact section 225 can include one or more semiconductors, which are different than conductors and insulators. According to one or more embodiments, the back contact section 225 provides a tunnel junction or an ohmic contact on a bottom, back, rear or Z1 side of the second transmissive absorber section 220. According to one or more embodiments, the back contact section 225 can have no bias on voltage or current changes and provide a stable and low resistance contact for cadmium (Cd) alloys.

For instance, the composition 252 of the back contact section 225 can include one or more gold (Au), aluminum (Al), platinum (Pt), zinc telluride (ZnTe) (e.g., doped with Copper (Cu) or other material), zinc telluride (ZnTe) based alloy (e.g., doped with Copper (Cu) or other material), or other material/alloy at a thickness that maintains transmissivity. The composition 252 of the back contact section 225 can be selected and configured in view of the description herein.

The thickness 242 of the back contact section 225 can include a section thickness along a range from fifty (50) nanometers (nm) to one hundred fifty (150) nanometers (nm) (e.g., at approximately 200 nm of back contact. Note that conductive sections of conventional and traditional solar cells are generally opaque; thus, the transmissive cadmium (Cd) alloy solar cell 200 either replaces these conductive sections with transmissive conductors and/or semiconductors or reduces a thickness thereof to a transmissive dimension (i.e., five (5) to two hundred (200) nanometers or nm for gold (Au)).

As shown in FIG. 2 optimized bandgap 262 of the back contact section 225 can include be greater than 2.0 eV.

The second conductive section 230 is transmissive. The second conductive section 230 (e.g., a back electrode) can include material that provides an electrical path for electricity to leave the transmissive cadmium (Cd) alloy solar cell 200. The material of the second conductive section 230 can include a conductive glass, a conductive plastic, or other conductive material with a transmissive quality (e.g., including FTO, ITO, or other transparent conductive oxide, as well as or in the alternative one or more of ultra-thin carbon (C), ultra-thin aluminum (Al), ultra-thin gold (Au), and graphene). The second conductive section 225 can include a section thickness along a range from two hundred (200) nanometers (nm) to six hundred (600) nanometers (nm) (e.g., at approximately 400 nm).

The second substrate section 235 can be any glass or plastic that is transmissive. According to one or more embodiments, the transmissive quality of the second substrate section 235 includes a high transmissivity that transmits the light spectrum. The second substrate section 235 can be also be conductive. According to one or more embodiments, the second substrate section 235 can include a section thickness along a range from one (1) millimeters (mm) to four (4) millimeters (mm) (e.g., at approximately 3.2 mm). An example of the second substrate section 235 can include, but is not limited to, a FTO-coated glass of ITO-coated glass.

As described herein, the transmissive cadmium (Cd) alloy solar cell 200 receives the light 102 from at least the sun 101. As shown in FIG. 2, the light 102 can include at least one or more portions 291.03, 291.04, 291.05, 291.06, 291.07, 291.08, 291.09, 291.10, 291.11, and 291.12. The one or more portions 291.03, 291.04, 291.05, 291.06, 291.07, 291.08, 291.09, 291.10, 291.11, and 291.12 can respectively represent the light 102 at approximately three hundred (300), four hundred (500), five hundred (500), six hundred (600), seven hundred (700), eight hundred (800), nine hundred (900), one thousand (1,000), one thousand one hundred (1,100), and one thousand two hundred (1,200) nanometers (nm) wavelengths. The one or more portions 291.03, 291.04, 291.05, 291.06, 291.07, 291.08, 291.09, 291.10, 291.11, and 291.12 are depicted as solid arrows to represent that the light 102 at that wavelength has a full amount of energy. Note that these wavelength values illustrate the light 102 as presented by the sun 101 across the full light spectrum including between these values and not at just those exact values.

The transmissive cadmium (Cd) alloy solar cell 200 absorbs and converts one or more portions 291.03, 291.04, 291.05, 291.06, 291.07, 291.08, 291.09, 291.10, 291.11, and 291.12 into electrical power or electricity and transmits one or more remaining portions 296.03, 296.04, 296.05, 296.06, 296.07, 296.08, 296.09, 296.10, 296.11, and 296.12 out of the Z1 side (e.g., a side opposite the sun 101) of transmissive cadmium (Cd) alloy solar cell 200 and in the Z1 direction, as the transmitted light 204. Similarly, the one or more remaining portions 296.03, 296.04, 296.05, 296.06, 296.07, 296.08, 296.09, 296.10, 296.11, and 296.12 can respectively represent the light 204 at approximately three hundred (300), four hundred (500), five hundred (500), six hundred (600), seven hundred (700), eight hundred (800), nine hundred (900), one thousand (1,000), one thousand one hundred (1,100), and one thousand two hundred (1,200) nanometers (nm) wavelengths. Note that these wavelength values illustrate the light 204 as affected by the transmissive cadmium (Cd) alloy solar cell 200 across the full light spectrum including between these values and not at just those exact values. In this regard, the one or more remaining portions 296.03, 296.04, 296.05, 296.06, 296.07, 296.08, 296.09, 296.10, 296.11, and 296.12 are depicted with arrows that include degrees of shading to illustrate a spectral response of the second transmissive absorber section 220 to the one or more portions 291.03, 291.04, 291.05, 291.06, 291.07, 291.08, 291.09, 291.10, 291.11, and 291.12. When increased or optimized, the optimized bandgap 261a is shown with respect to the light portions 291.08 and remaining light portion 296.08 to represent an increased bandgap value of 1.70 eV. When further increased or further optimized, the optimized bandgap 261b is shown with respect to the light portions 291.06 and remaining light portion 296.06 to represent an increased bandgap value of 2.00 eV.

The sections of the transmissive cadmium (Cd) alloy solar cell 200 are manufactured in a vertical or Z direction, and each Z surface of the sections of the transmissive cadmium (Cd) alloy solar cell 200 can include an anti-reflective coating. The antireflective coatings can be manufactured at particular thicknesses, and tuning for every section of the transmissive cadmium (Cd) alloy solar cell 200.

According to one or more embodiments, the transmissive cadmium (Cd) alloy solar cell 200 can be manufactured in a superstrate configuration in an order where the layers are deposited in decreasing deposition temperatures. For instance, to achieve the optimized bandgap 261 as described herein, deposition of the sections can be from section 235 to section 205 with decreasing deposition temperatures, so the deposition of any subsequent sections does not detrimentally affect one or more proceeding sections. Further, in the superstrate configuration, the section are deposited on a "superstrate" (e.g., usually a transparent/transmissive material like glass) so that the light 102 enters through the superstrate, which is the first section deposited.

According to one or more embodiments, the transmissive cadmium (Cd) alloy solar cell 200 can be manufactured in a substrate configuration in an order where the layers are deposited in decreasing deposition temperatures. For instance, to achieve the optimized bandgap 261 as described herein, deposition of the sections can be from section 205 to section 235 with decreasing deposition temperatures, so the deposition of any subsequent sections does not detrimentally affect one or more proceeding sections. Further, in the superstrate configuration, the section are deposited on a "substrate" (e.g., usually a rigid material like glass or metal) so that the light 102 enters through a top section, which is the last section deposited.

Figure 3:
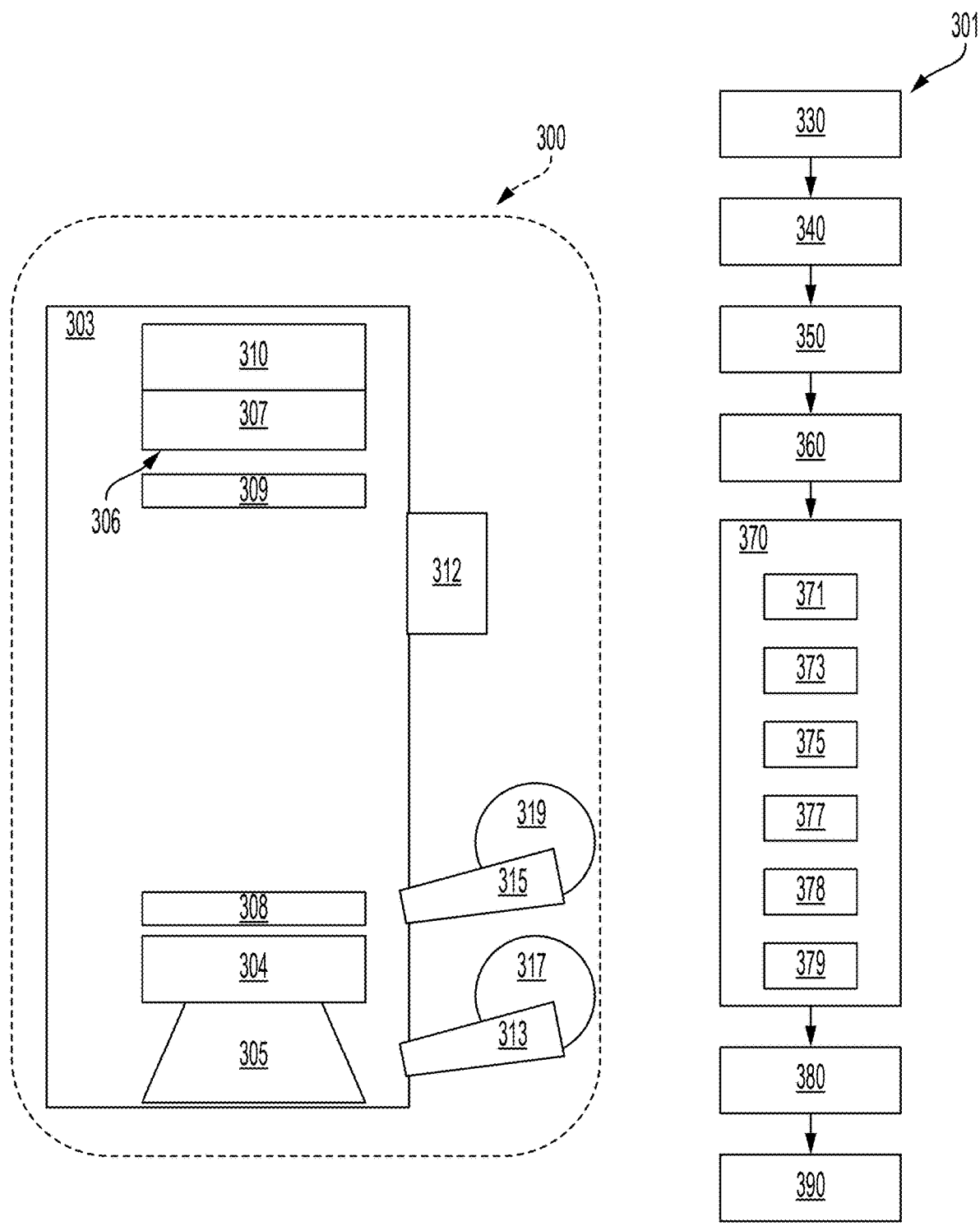
FIG. 3 depicts an example deposition system and method according to one or more embodiments.

FIG. 3 depicts an example deposition system 300 and method 301 according to one or more embodiments. The example deposition system 300 can be any deposition system, example of which include sputtering systems, evaporation systems, sublimation systems, chemical vapor deposition systems, magnetron sputtering systems, atomic layer depositions systems, pulsed laser deposition systems, etc. The method 301 is an example operational process of the example deposition system 300. For ease of explanation, the example deposition system 300 and the method 301 are described with respect to a sputtering operation, though not limited thereto.

The example deposition system 300 includes a vacuum chamber 303. The vacuum chamber 303 is a sealed chamber where the sputtering operation occurs and a low pressure is maintained to facilitate a movement of ions. A target material 304 (e.g., a cathode) is mounted within the vacuum chamber 303 and is a material to be deposited. The substrate 307 (e.g., an anode) includes a surface 306 where the target material 304 will be deposited, and grounded or maintained at a potential to provide material benefits to the deposition. For instance, with respect to sputtering, after the target material 304 and the substrate 307 are configured in the vacuum chamber 303, the vacuum chamber 303 is pressurized and the first gas 317 is introduced therein. The target material 304 within the vacuum chamber 303 is provided from a sputter gun 305 to coat (e.g., to be deposited on) the surface 306 of the substrate 307. More particularly, when a voltage is applied to the target material 304 via the sputter gun 305, ions of the first gas 317 are accelerated towards the target material 304 and knock off atoms therefrom. These atoms are then deposited on the surface 306 of the substrate 307, forming a section thereon. Thus, any section of the substrate 307 can be formed by sputtering (e.g., ionization, ion bombardment, and deposition).

The method 301 refers to sputtering sections of the transmissive cadmium (Cd) alloy solar cell 200 of FIG. 2 according to one or more embodiments. According to one or more embodiments, materials deposited in a superstrate configuration from a sun side to a side opposite the sun side to sequentially form sections of the transmissive cadmium (Cd) alloy solar cell 200 of FIG. 2. According to one or more other embodiments, the materials can be sequentially deposit in a substrate configuration from the side opposite the sun side to the sun side.

The example deposition system 300 also includes shutters 308 and 309, a substrate holder system 310, a pumping system 312, and mass flow controllers 313 and 315 that respectively provide a first gas 317 and a second gas 319. The shutters 308 and 309 can be panels that are movable in and out of position between the target material 304 and the substrate to respectively cover and expose both, as well as intermediate positions. The substrate holder system can include a heating device that based on a set point temperature heats the substrate in preparation for deposition. The pumping system 312 draws gas particles from the vacuum chamber 303 to leave behind a partial vacuum. The pumping system 312 is operated to provide at least a base pressure and a sputtering pressure within the vacuum chamber 303. The mass flow controllers 313 and 315 are devices that accurately control a supply the first gas 317 and the second gas 319, subsequently. The first gas 317 can be an inert gas (e.g., argon gas (Ar)) introduced into the vacuum chamber 303, which is ionized to create a plasma. The second gas 319 can be hydrogen gas ($H_2$) though other gases and gas mixtures are contemplated. Note that while one item is shown in the example deposition system 300, any individual item can represent more than one of that item.

The method 301 begins at block 330, where one or more substrate section materials are deposited. By way of example, after the one or more substrate section materials are placed on the sputter gun 305 and the substrate 307 is mounted within the vacuum chamber 303, the pumping system 312 pressurizes the vacuum chamber 303 and the mass flow controller 313 introduces the first gas 317. The substrate holder system 310 heats the substrate 307. Then, the one or more substrate section materials are sputtered onto the substrate 307 (e.g., to complete the substrate section 205).

At block 340, one or more conductive section materials are deposited. Similarly, and by way of example, after the one or more conductive section materials are placed on the sputter gun 305, the pumping system 312 pressurizes the vacuum chamber 303 and the mass flow controller 313 introduces the first gas 317. The substrate holder system 310 heats the substrate 307. Then, the one or more conductive section materials are sputtered onto the substrate 307 (e.g., onto the substrate section 205 to complete the conductive section 210).

At block 350, one or more first transmissive absorber section materials are deposited. The one or more first transmissive absorber section materials can include MZO, cadmium (Cd), selenide (Se), telluride (Te), or any combination thereof. According to one or more embodiments, the one or more first transmissive absorber section materials include cadmium selenide telluride (CdSeTe) with a selenium concentration of fifty percent (50%) or more. The selenium concentration can be at or approximately ninety percent (90%). Accordingly, after the one or more first transmissive absorber section materials are placed on the sputter gun 305, the pumping system 312 pressurizes the vacuum chamber 303 and the mass flow controller 313 introduces the first gas 317.

The substrate holder system 310 heats the substrate 307. The substrate holder system 310 is set to a set point temperature. For example, the substrate holder system 310 is set to a set point temperature to heat a deposition surface of a partially manufactured cadmium (Cd) alloy transmissive to a calibrated first transmissive absorber deposition temperature (e.g., a surface of the conductive section 210). The calibrated first transmissive absorber deposition temperature is a surface offset temperature of the substrate 307 that differs from the set point temperature. The calibrated first transmissive absorber deposition temperature is required to achieve a temperature on the surface (for receiving the one or more first transmissive absorber section materials) while guaranteeing integrity of the first transmissive absorber section during subsequent depositions of other sections. The calibrated first transmissive absorber deposition temperature can be a value along a range of two hundred (200) degrees Celsius (° C.) to six hundred (600) degrees Celsius (° C.). Two sputter guns 305 can be used to deposit a MZO followed by a cadmium selenide telluride (CdSeTe) to form the first transmissive absorber section. In this regard, a first sputter gun 305 can sputter the MZO (e.g., onto a surface of the conductive section 210), which has a calibrated first transmissive absorber deposition temperature of three hundred (300) degrees Celsius (° C.). Then, a second sputter gun 305 can sputter the cadmium selenide telluride (CdSeTe) onto the MZO, which can have a same calibrated first transmissive absorber deposition temperature of three hundred (300) degrees Celsius (° C.). Once sputtering of the cadmium selenide telluride (CdSeTe) is complete, the first transmissive absorber section is formed (e.g., the first transmissive absorber section 215).

At block 360, one or more second transmissive absorber section materials are deposited. The one or more second transmissive absorber section materials can include cadmium (Cd), selenide (Se), telluride (Te), or any combination thereof. According to one or more embodiments, the one or more second transmissive absorber section materials include a cadmium (Cd) alloy, e.g., cadmium selenide telluride (CdSeTe), cadmium selenide (CdSe), cadmium telluride (CdTe), or a cadmium selenide telluride/cadmium telluride (CdSeTe/CdTe) combination. Accordingly, after the one or more second transmissive absorber section materials are placed on the sputter gun 305, the pumping system 312 pressurizes the vacuum chamber 303 and the mass flow controller 313 introduces the first gas 317.

The substrate holder system 310 heats the substrate 307. The substrate holder system 310 is set to a set point temperature. For example, the substrate holder system 310 is set to a set point temperature to heat a deposition surface of a partially manufactured cadmium (Cd) alloy transmissive to an calibrated absorber temperature (e.g., a surface of the first transmissive absorber section 215). The calibrated second transmissive absorber temperature is a surface offset temperature of the substrate 307 that differs from the set point temperature. The calibrated second transmissive absorber temperature is required to achieve a temperature on the surface (for receiving the one or more second transmissive absorber section materials) while guaranteeing integrity of the second transmissive absorber section during subsequent depositions of other sections. The calibrated second transmissive absorber temperature can be along a range of one hundred (100) degrees Celsius (° C.) to three hundred fifty (350) degrees Celsius (° C.). The calibrated second transmissive absorber temperature can be at or approximately two hundred ten (210) degrees Celsius (° C.) or two hundred twenty (220) degrees Celsius (° C.). One or more technical effects, advantages, and benefits of the method 301 include, but are not limited to, the calibrated second transmissive absorber temperature being lower (a cooler temperature) than the calibrated first transmissive absorber deposition temperature so that the first transmissive absorber section or any preceding section is not damaged or destroyed during deposition of the one or more absorber second transmissive absorber materials. Further, the calibrated second transmissive absorber temperature being lower (a cooler temperature) than the calibrated first transmissive absorber deposition temperature solves the technical problem of the selenium (Se) reevaporates and leaves the substrate 307, thereby preventing the manufacturing of a working transmissive cadmium (Cd) alloy solar cells.

Additionally, at block 360, a post deposition annealing can be performed. The post deposition annealing can be applied to the one or more second transmissive absorber section materials. The post deposition annealing can be applied for an annealing time period and at an annealing temperature. The annealing time period can be at or approximately one (1) hour. The annealing temperature can be a surface offset temperature along a range of one hundred (100) degrees Celsius (° C.) to three hundred fifty (350) degrees Celsius (° C.). The annealing temperature can be at or approximately two hundred ten (210) degrees Celsius (° C.) or two hundred twenty (220) degrees Celsius (C).

Additionally, at block 360, a cadmium chloride (CdCl2) post-deposition treatment can be performed. The cadmium chloride (CdCl2) post-deposition treatment can be applied to the one or more second transmissive absorber section materials at a treatment temperature. The treatment temperature is also a surface offset temperature of the substrate 307 that differs from the set point temperature. The treatment temperature can be a value along a range of three hundred eighty-five (385) degrees Celsius (° C.) to four hundred twenty-five (425) degrees Celsius (° C.). The treatment temperature can be at or approximately four hundred (400) degrees Celsius (° C.).

At block 370, a back contact section is manufactured. Accordingly, after the target material 304 is placed on the sputter gun 305, the pumping system 312 pressurizes the vacuum chamber 303 and the mass flow controllers 313 and 315 introduce the first gas 317 and the second gas 319, respectively.

At sub-block 371, the vacuum chamber 303 is pumped by the pumping system 312 to a base pressure. The base pressure can be at or lower than 1e-5 Torr. The base pressure can be at or approximately 9e-8 Torr. One or more technical effects, advantages, and benefits of the method 301 include, but are not limited to, the base pressure removing contaminates and residual oxygen from the vacuum chamber thereby effectively cleaning therein.

At sub-block 373, the vacuum chamber 303 is pumped by the pumping system 312 to a sputtering pressure. For example, the vacuum chamber 303 is raised from the base pressure to the sputtering pressure. The sputtering pressure can be at or lower than 10e-3 Torr. The sputtering pressure can be at or approximately 3e-3 Torr.

At sub-block 375, the mass flow controller 313 provides the first gas 317 into the vacuum chamber 303. The first gas 317 can be provided at a rate that balances a flow of the first gas 317 in and out of the vacuum chamber 303 with respect to the sputtering pressure. For example, the mass flow controller 313 and pumping system 312 can work in concert to achieve the sputtering pressure.

At sub-block 377, the substrate holder system 310 heats the substrate 307. The substrate holder system 310 can be set to a set point temperature to heat the substrate 307 until the surface 306 reaches a calibrated deposition temperature. The calibrated deposition temperature is a surface offset temperature of the substrate 307 that differs from the set point temperature. The calibrated deposition temperature is required to achieve a back contact section deposition temperature on the surface 306 (for receiving the one or more back contact section materials) while guaranteeing integrity of all preceding section during back contact deposition and guaranteeing integrity of the back contact section during subsequent depositions of other sections. The calibrated deposition temperature can be along a range of two hundred (200) degrees Celsius (° C.) to six hundred (600) degrees Celsius (° C.). The calibrated deposition temperature can be at or approximately three hundred (300) degrees Celsius (° C.). One or more technical effects, advantages, and benefits of the method 301 include, but are not limited to, the calibrated absorber temperature being lower (a cooler temperature) than the calibrated first transmissive absorber deposition temperature so that the first transmissive absorber section or any preceding section is not damaged or destroyed during deposition of the one or more second transmissive absorber section materials.

At sub-block 378, the mass flow controller 315 provides the second gas 319 into the vacuum chamber 303. The second gas 319 can be provided at a rate that balances a flow of the first gas 317 and the second gas 319 in and out of the vacuum chamber 303 with respect to the sputtering pressure. For example, the mass flow controllers 313 and 315 and pumping system 312 can work in concert to achieve/maintain the sputtering pressure. According to one or more embodiments, the mass flow controllers 313 and 315 and pumping system 312 respectively provide into the vacuum chamber 303 the first gas 317 and the second gas 319 at a proportional rate to achieve a target gas mix while maintaining the sputtering pressure (i.e., while balancing the argon gas (Ar) and the hydrogen gas ($H_2$) and while running the pumping system 312). The target gas mix can include the hydrogen gas ($H_2$) at or below 1.00%. The target gas mix can include the hydrogen gas ($H_2$) at or approximately at 0.1%. According to one or more embodiments, the first gas 317 and the second gas 319 are provided across a plurality of phases to achieve the target gas mix. According to one or more embodiments, the hydrogen gas ($H_2$) includes a pre-blended hydrogen gas mix (e.g., for multistage gas mixing).

At sub-block 379, the target material 304 is deposited. The target material 304 can include zinc (Zn), telluride (Te), or any combination thereof. According to one or more embodiments, the target material 304 can include copper-doped zinc telluride (ZnTe:Cu). The target material 304 is deposited onto the surface 306 to form a back contact section of the cadmium (Cd) alloy transmissive solar cell. The deposition of the target material 304 is controlled by operating the shutters 308 and 309. The deposition of the target material 304 is controlled by operating the shutters 308 and 309 while adjusting the target gas mix.

Additionally, at sub-block 379, the target material 304 is deposited onto the surface 306 at a deposition rate. The deposition rate of the target material 304 is controlled by setting a power of the sputter gun 305. The power of the sputter gun 305 can be set to a calibrated power density. The deposition rate of the target material 304 is also controlled by performing the depositing for a specified time. The deposition rate of the target material 304 can be one (1) to five (5) angstroms per second. The calibrated power density and the specified time can together achieve a section thickness. The section thickness can be along a range of twenty (20) nanometers (nm) to one hundred and fifty (150) nanometers (nm). Thus, the back contact section is deposited.

Additionally, at sub-block 379, the target material 304 can be deposited in phases.

According to one or more embodiments, a pre-sputter phase can be implemented. The pre-sputter phase can be for at or approximately five (5) minutes or until normal the vacuum chamber has normalized/stabilized. The hydrogen gas ($H_2$) is turned off during the pre-putter phase, e.g., at the beginning of the pre-sputter phase. During the pre-sputter phase, the target material 304 is turned on (e.g., electricity is being applied to produce a plasma), though there in no depositing on the surface 306 because one or both of the shutters 308 and 309 are in a closed position. Once normalized/stabilizes, then the shutters 308 and 309 are opened. By way of example, open the shutter 308 over the target material 305 and turn on plasma and sputtering materials into the vacuum chamber 303 for a period of time until plasma and environment stabilizes, and then open the shutter 309 over the substrate 307.

According to one or more embodiments, a flow of the hydrogen gas ($H_2$) is turn off partway through deposition (e.g., deposit one (1) nanometers (nm) to twenty (20) nanometers (nm) of the back contact layer section, then turn off the hydrogen gas ($H_2$)).

According to one or more embodiments, a flow of the hydrogen gas ($H_2$) is turn on partway through deposition (e.g., deposit one (1) nanometers (nm) to twenty (20) nanometers (nm) of the back contact layer section, then turn on the hydrogen gas ($H_2$)).

Generally, the hydrogen gas ($H_2$) and related plasma-generated species (e.g., H, $H_2$, $H_3$, etc.) can interact with residual oxygen and related plasma-generated species (e.g., O, $O_2$, $O_3$) and water and related plasma-generated species (e.g., $H_2O$, H, $H_2$, $H_3$, O, $O_2$, $O_3$, etc.), producing species (e.g., OH, $H_2O$, etc.) that are less likely than other species (e.g., O, $O_2$) to incorporate into the zinc telluride-based (ZnTe) contact materials. For instance, the hydrogen gas ($H_2$) may not go into the back contact section, may bond with residual oxygen (e.g., OH), may make water ($H_2O$) and/or take other forms (e.g., H, $H_2$, $O_3$), and may get pumped out of the vacuum chamber 303 resulting in an environment that is less likely than other species (e.g., O, $O_2$) to incorporate into the zinc telluride-based (ZnTe) contact materials.

At block 380, one or more back electrode section materials are deposited. Similarly, and by way of example, after the one or more back electrode section materials are placed on the sputter gun 305, the pumping system 312 pressurizes the vacuum chamber 303 and the mass flow controller 313 introduces the first gas 317. The substrate holder system 310 heats the substrate 307. Then, the one or more back electrode section materials are sputtered onto the substrate 307 (e.g., onto the back contact section 225 to complete the back electrode section 230).

At block 390, one or more back substrate section materials are deposited. Similarly, and by way of example, after the one or more back substrate section materials are placed on the sputter gun 305, the pumping system 312 pressurizes the vacuum chamber 303 and the mass flow controller 313 introduces the first gas 317. The substrate holder system 310 heats the substrate 307. Then, the one or more back substrate section materials are sputtered onto the substrate 307 (e.g., onto the back electrode section 230 to complete the back substrate section 235). Thus, the transmissive cadmium (Cd) alloy solar cell 200 of FIG. 2 is complete.

Figure 4:
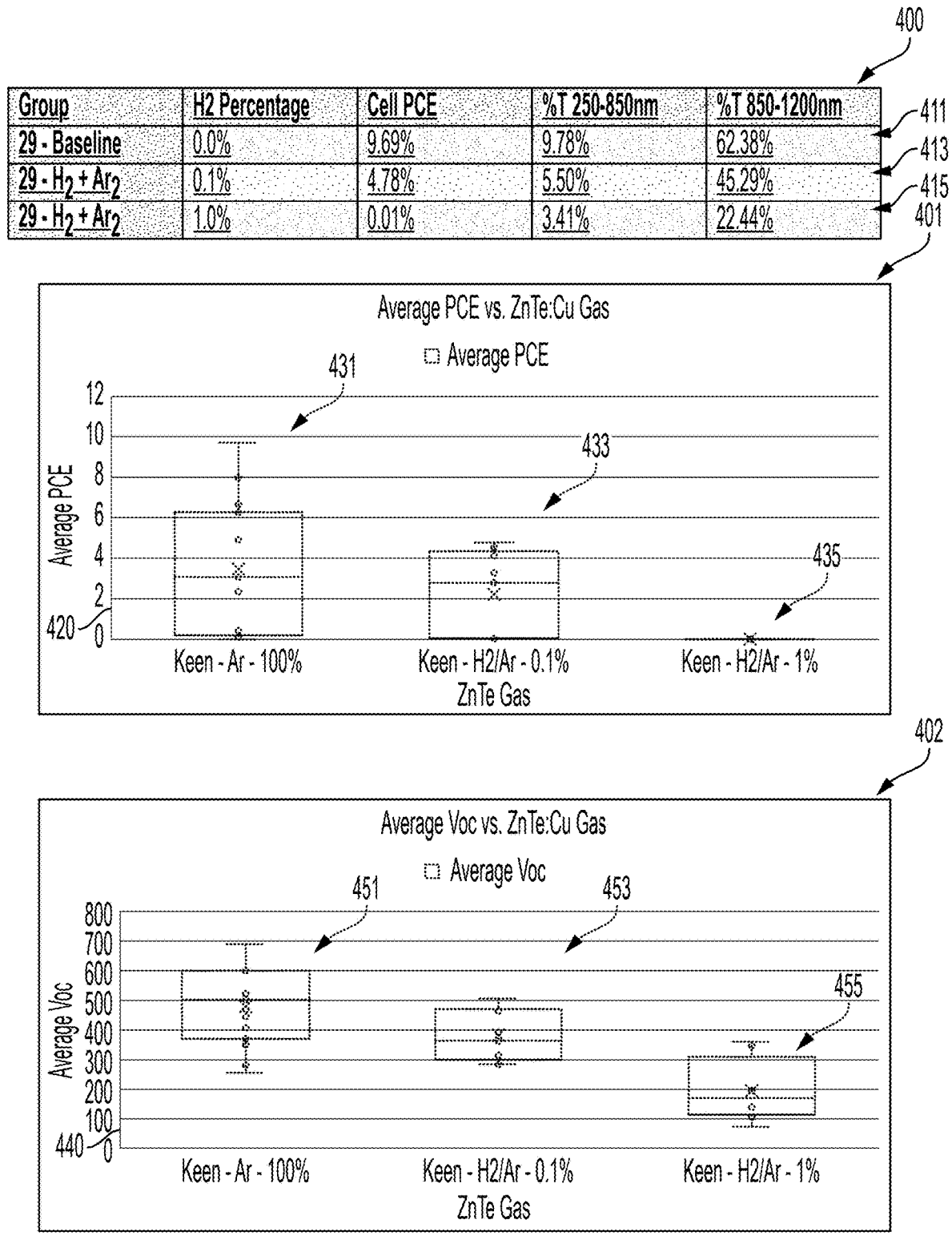
FIG. 4 depicts a table and graphs according to one or more embodiments.

FIG. 4 depicts a table 400 and graphs 401 and 402. The table 400 and graphs 401 and 402 provide hydrogen gas ($H_2$) research with respect to a particularly set of lab experiments on a particular set of cell samples (e.g., Group 29 samples, as labeled in the real world lab). The table 400 provides a baseline (row 411) with zero percent (0%) hydrogen gas (H$_2$), first target gas mix (row 413) with point one percent (0.1%) hydrogen gas (H$_2$), and second target gas mix (row 415) with one percent (1.0%) hydrogen gas (H$_2$). The graph 401 depicts average PCE data (y-axis 420) via diagrams 431, 433, 435 respective to the table 400 for the three rows 411, 413, 415 of table 400. The graph 402 depicts average voltage data (y-axis 420) via diagrams 451, 453, 455 respective to the table 400 for the three rows 411, 412, 413 of table 400.

The Group 29 samples used a traditional transmissive device architecture to create a baseline (see row 411 of table 400) of an impact on the copper-doped zinc telluride (ZnTe:Cu) back contact section within an already understood and quantified transmissive device architecture. Further, the table 400 and the graphs 401 and 402 depicts the results of Group 29 samples, where the presence of hydrogen gas (H$_2$) (see rows 413 and 415 of table 400) significantly reduced a corresponding device performance (expected based on Thesis 1996 original resistivity findings) and also reduced a corresponding total device transmissivity (unexpected based on Thesis 1996 original optical findings).

Figure 5:
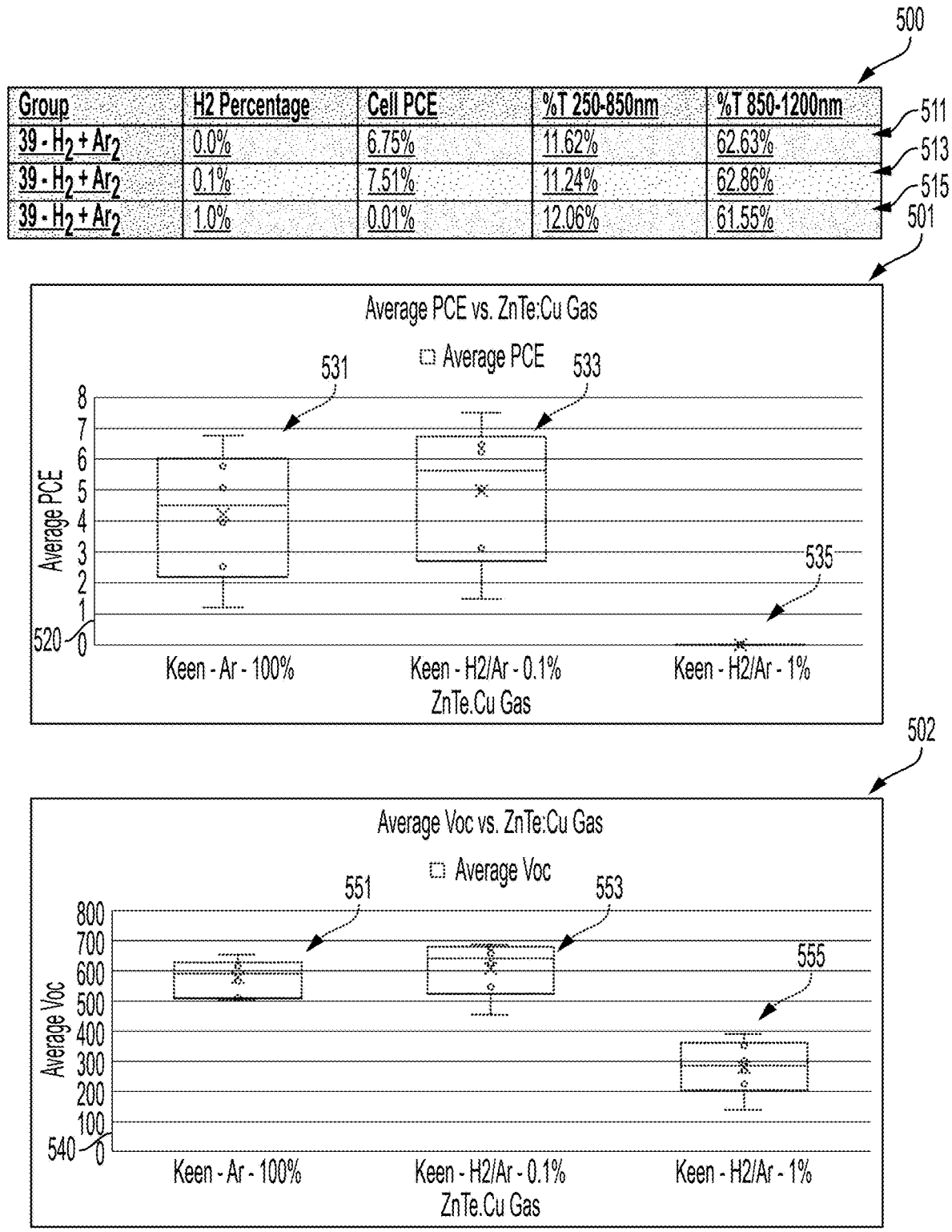
FIG. 5 depicts a table and graphs according to one or more embodiments.

FIG. 5 depicts a table 500 and graphs 501 and 502 according to one or more embodiments. The table 500 and graphs 501 and 502 repeat the Group 29 experiment series with Group 39 samples. As compared to the Group 29 samples, the copper-doped zinc telluride (ZnTe:Cu) back contact for the Group 39 samples was reduced from one hundred (100) nanometers (nm) to fifty (50) nanometers (nm), the deposition temperature was increased, and other parameters were adjusted.

The table 500 provides a baseline (row 511) with zero percent (0%) hydrogen gas (H$_2$), first target gas mix (row 513) with point one percent (0.1%) hydrogen gas (H$_2$), and second target gas mix (row 515) with one percent (1.0%) hydrogen gas (H$_2$). The graph 501 depicts average PCE data (y-axis 520) via diagrams 531, 533, 535 respective to the table 500 for the three rows 511, 513, 515 of table 500. The graph 502 depicts average voltage data (y-axis 520) via diagrams 551, 553, 555 respective to the table 500 for the three rows 511, 513, 515 of table 500. As seen in the FIG. 5, the Group 39 samples with the adjusted parameters demonstrates both positive improvements based on hydrogen gas (H$_2$) content in both electrical and optical properties of the completed solar cells.

According to one or more embodiments, the Group 39 samples indicate that transmission in a visible spectrum (e.g., approximately two hundred fifty (250) nanometers (nm) to approximately eight hundred fifty (850) nanometers (nm)) increases as observed by the Thesis 1996 and Faulkner 2016, but also decreases minimally in the near infrared spectrum (eight hundred fifty (850) nanometers (nm) to one thousand two hundred (1200) nanometers (nm)). The Group 29 samples and the Group 39 samples also indicate that there is an optimal hydrogen gas (H$_2$) concentration, above which, cells become non-functional while the optical properties continue to improve. Thus, the addition of the hydrogen gas (H$_2$) to the argon (Ar) is not a simple process as this addition can yield non-functioning solar cells. The concentration of hydrogen gas (H$_2$) present must be controlled and tuned specifically, along with other deposition parameters (e.g., thickness and temperature) to optimize a device. And these optimizations must be performed on a fully completed device as the thin film optimizations and corresponding results are unrelated and provide in incorrect conclusions.

Additionally, data across the Group 29 samples and the Group 39 samples indicate how deposition parameters (for all sections) can influence a change in electrical and optical properties of that the hydrogen gas (H$_2$) concentration has on a device. The deposition parameters include, but are not limited to, a copper-doped zinc telluride (ZnTe:Cu) back contact thickness, a copper-doped zinc telluride (ZnTe:Cu) back contact deposition temperature, a selenium concentration in a cadmium selenide telluride (CdSeTe) first transmissive absorber section, a cadmium selenide telluride/cadmium telluride (CdSeTe/CdTe) deposition temperature, a cadmium selenide telluride/cadmium telluride (CdSeTe/CdTe) post deposition annealing time, a cadmium selenide telluride/cadmium telluride (CdSeTe/CdTe) post deposition temperature, a MZO deposition temperature, and a cadmium chloride (CdCl2) post-deposition treatment temperature. Accordingly, the incorporation of hydrogen gas (H$_2$) into a cadmium telluride (CdTe) based solar cell with a copper-doped zinc telluride (ZnTe:Cu) back contact requires testing, evaluation, and tuning of a 9-way parameter matrix, which at one set of parameters creates a totally non-functional device and at certain parameters creates and optimized electrical and optical device (showing unexpected results).

Figure 6:
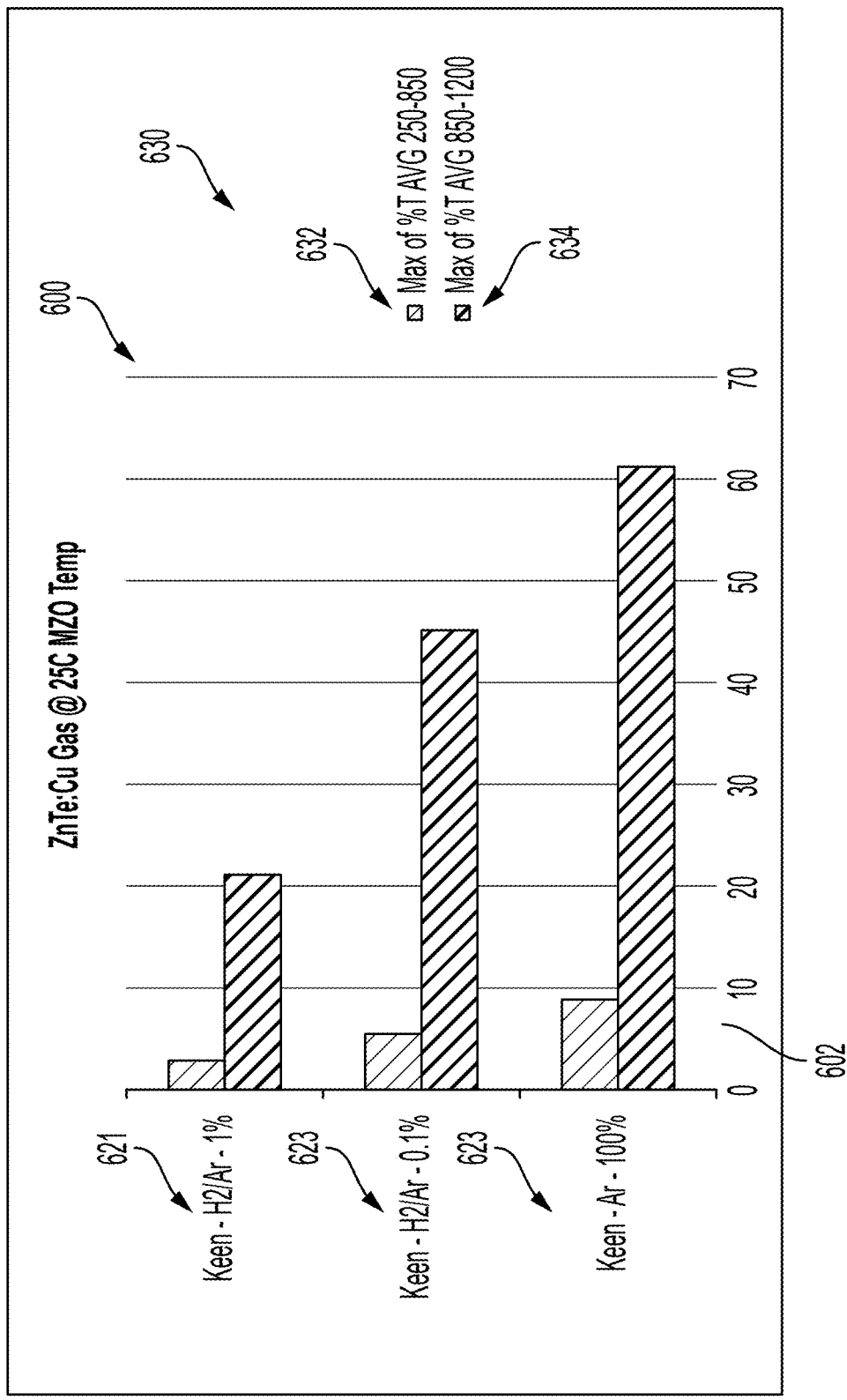
FIG. 6 depicts a graph according to one or more embodiments.

FIG. 6 depicts a graph 600 according to one or more embodiments. The graph 600 depicts average transmissivity (x-axis 602) of a copper-doped zinc telluride (ZnTe:Cu) back contact for three samples 621, 623, 624. The graph key 630 identifies the bars as a maximum of a transmissivity percentage average 632 for two hundred fifty (250) nanometers (nm) to approximately eight hundred fifty (850) nanometers (nm) and a maximum of a transmissivity percentage average 634 for eight hundred fifty (850) nanometers (nm) to approximately one thousand two hundred (1200) nanometers (nm).

Figure 7:
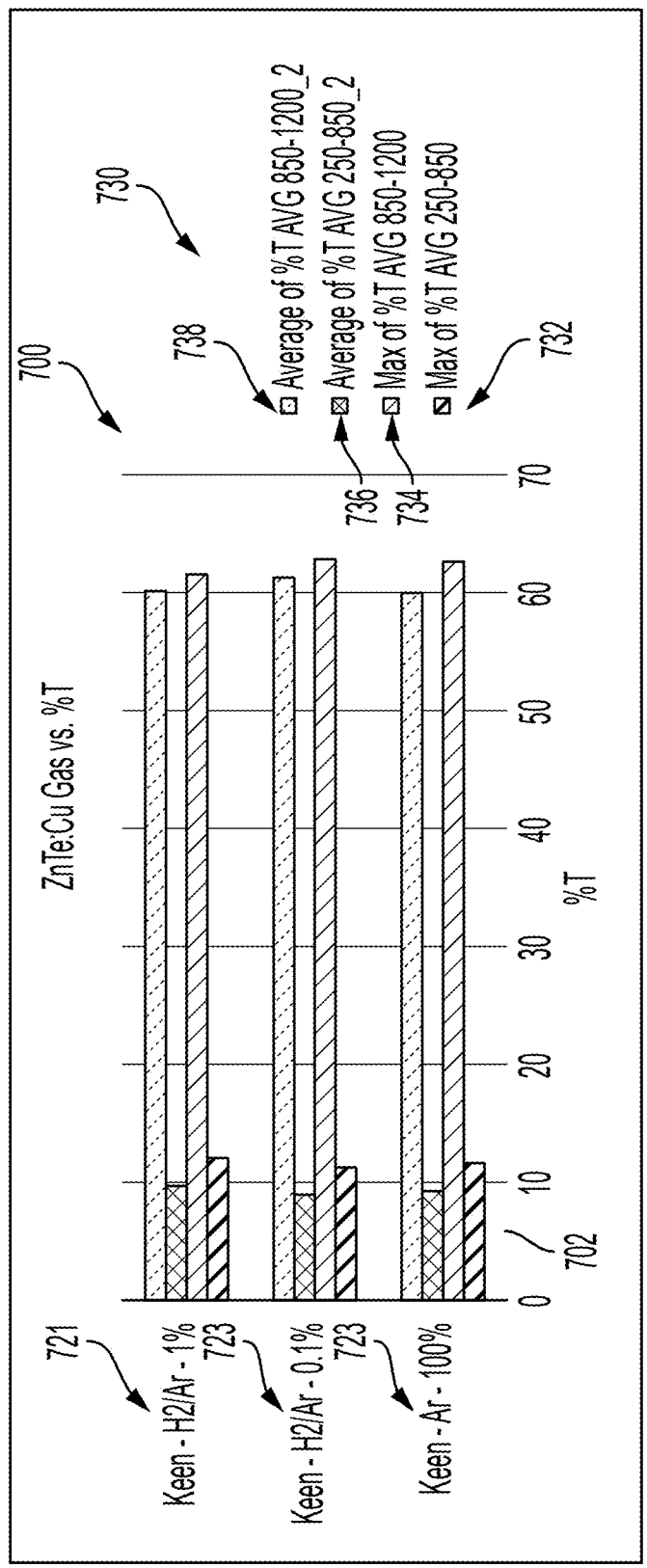
FIG. 7 depicts a graph according to one or more embodiments.

FIG. 7 depicts a graph 700 according to one or more embodiments. The graph 700. The graph 700 depicts average transmissivity (x-axis 702) of a copper-doped zinc telluride (ZnTe:Cu) back contact for three samples 721, 723, 724. The graph key 730 identifies the bars as a maximum of a transmissivity percentage average 732 for two hundred fifty (250) nanometers (nm) to approximately eight hundred fifty (850) nanometers (nm) and a maximum of a transmissivity percentage average 734 for eight hundred fifty (850) nanometers (nm) to approximately one thousand two hundred (1200) nanometers (nm). The graph key 730 also identifies the bars as an average of a transmissivity percentage average 736 for two hundred fifty (250) nanometers (nm) to approximately eight hundred fifty (850) nanometers (nm) and an average of a transmissivity percentage average 738 for eight hundred fifty (850) nanometers (nm) to approximately one thousand two hundred (1200) nanometers (nm).

Figure 8:
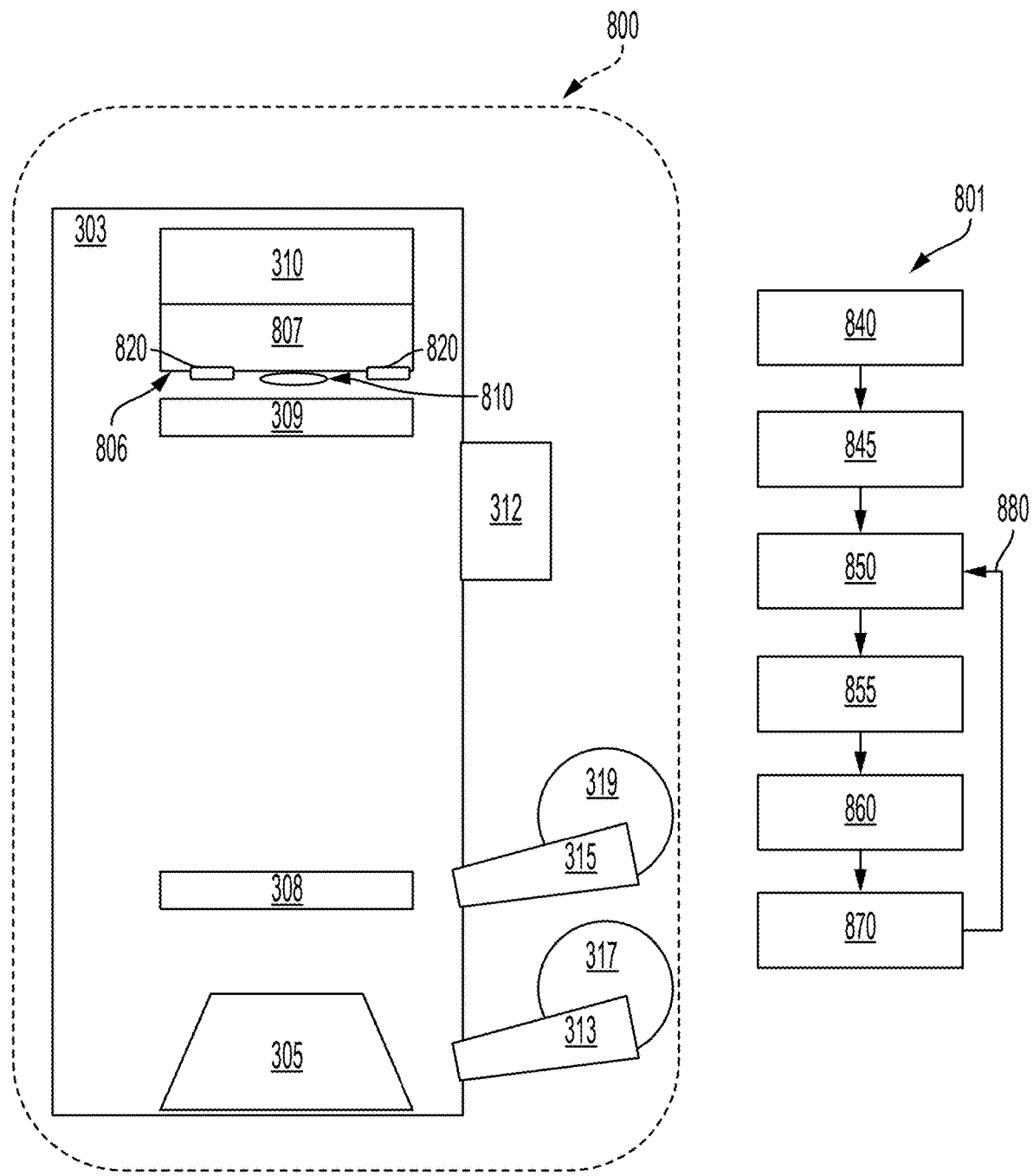
FIG. 8 depicts an example deposition system and method according to one or more embodiments.

FIG. 8 depicts an example deposition system 800 and method 801 according to one or more embodiments. The method 801 provides a calibrating of the example deposition system 800 to generate a plurality of time and temperature offsets. Note that the system and methods herein utilize the plurality of time and temperature offsets to achieve calibrated surface temperatures for manufacturing the transmissive cadmium (Cd) alloy solar cell. For ease of explanation, items and elements of the that are similar to previous Figures are reused and not reintroduced. Note that while one item is shown in the example deposition system 800, any individual item can represent more than one of that item. FIG. 8 includes a surface 806 of a glass 807 on which one or more sensing devices, e.g., one or more thermocouples 810 and one or more temperature indicating stickers 820.

The method 801 begins at block 840, where a glass is mounted in the vacuum chamber 303.

At block 845, the or more sensing devices are added on the surface 806 of the glass 807. According to one or more embodiments, the one or more thermocouples 810 are placed in contact with the surface 306. For example, a spring rod is used to hold the thermocouple 810. According to one or more embodiments, the one or more temperature indicating stickers 820 are placed on the surface 306. For example, a spring rod is used to hold the thermocouple 810.

At block 850, the substrate holder system 310 is set to a first set point temperature. The first set point temperature can include a value of one hundred fifty (150) degrees Celsius (° C.).

At block 855, a surface temperature on the surface 306 is continuously detected until a normalization. Normalization includes when the surface temperature has stabilized at a value.

At block 860, a time and a surface temperature offset is recorded at the normalization.

At block 870, the method 801 includes incrementing the first set point temperature to a next set point temperature. The first temperature is repeatedly incremented to the next set point temperature in twenty-five (25) degrees Celsius (° C.) increments. Then, the method 801 loops back to block 850 as shown by arrow 880. Accordingly, the substrate holder system 310 is set to the next set point temperature, a next surface temperature is detected at a next normalization respective to the next set point temperature, and recording a next time and a next surface temperature offset respective to the next set point temperature until the substrate holder system 310 is set to a last set point temperature. The last set point temperature can include a value at or approximately at six hundred (600) degrees Celsius (° C.). Thus, the method 901 loops through substrate holder system 310 settings from cold to hot measure output of the thermocouple 810 and/or the stickers 920 until normalize and then increment. Note that a time to normalize increases and offset between setting and surface increase.

At block 850, the plurality of time and temperature offsets are generated. The plurality of time and temperature offsets are generated for the example deposition system 800 from each recording at each increment from the first set point temperature to the last set point temperature.

Figure 9:
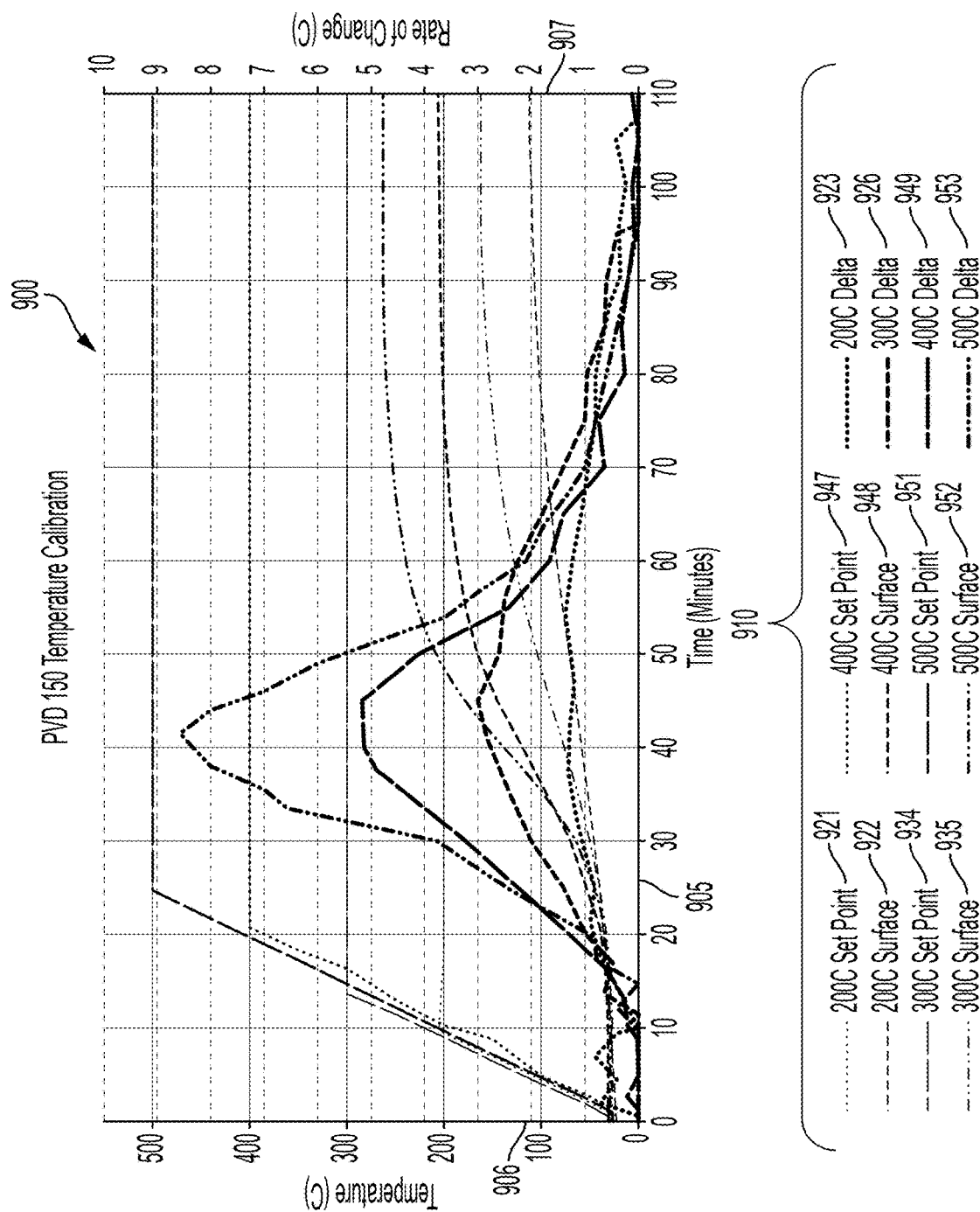
FIG. 9 depicts a graph according to one or more embodiments.

FIG. 9 depicts a graph 900 according to one or more embodiments. The graph 900 provides visual representation of a temperature calibration according to any the method 801 of FIG. 8. Plots of the graph 900 are depicted with respect to time (x-axis 905), temperate degrees Celsius (° C.) (y-axis 906), and rate of change degrees Celsius (° C.) (y-axis 907). Graph key 910 identifies the plots of the graph 900.

According to the method 801, the substrate holder system 310 is set to two hundred (200) degrees Celsius (° C.). Plot 921 shows an operation of the substrate holder system 310 as it heats from zero (0) degrees Celsius (° C.) to the two hundred (200) degrees Celsius (° C.) set point over approximately ten (10) minutes). Plot 922 shows temperature of the surface 806 of the glass 807 as it is heated by the substrate holder system 310 according to plot 921, and plot 923 shows a corresponding the rate of temperature change. According to the method 801, the set point of the substrate holder system 310 is incremented the next set point temperatures, i.e., three hundred (300) degrees Celsius (° C.) showing plots 934, 935, 936, four hundred (400) degrees Celsius (C) showing plots 947, 948, 949, and five hundred (500) degrees Celsius (° C.) showing plots 951, 952, 953. Thus, the last set point temperature is five hundred (500) degrees Celsius (° C.).

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof. It will be further understood that the terms "about" and/or "approximately," when used in this specification, specify a degree of variation from a stated value that is can be detected and can be determined. For example, the degree of variation can be a ±1% from the stated value. The "optimized" and "optimization" terms (as well as the "high" term) reference changing a value of a particular property (in contemplation of other properties) over conventional technologies, scholarship, and research to achieve and comparatively improve commercially viable electrical performance with transmissivity and manufacturability.

Although features and elements are described above in particular combinations, one of ordinary skill in the art will appreciate that each feature or element can be used alone or in any combination with the other features and elements. The drawings, graphs, flowcharts, and diagrams in the Figures illustrate the architecture, functionality, and operation of possible implementations of devices, apparatuses, and systems, and with respect to one or more methods, according to various embodiments. In this regard, each block in the flowchart or block diagrams may represent a module, a segment, a layer, a device, or portion of thereof. In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of calibrating a deposition device to generate a plurality of time and temperature offsets, the method comprising:

setting a substrate holder system of the deposition device to a first set point temperature;

continuously detecting a surface temperature on a calibration surface until a normalization temperature;

recording a time and a surface temperature offset at the normalization temperature;

repeatedly incrementing the first set point temperature to a next set point temperature, detecting a next surface temperature at a next normalization temperature respective to the next set point temperature, and recording a next time and a next surface temperature offset respective to the next set point temperature until the substrate holder system is set to a last set point temperature; and generate the plurality of time and temperature offsets for the deposition device from each recording at each increment from the first set point temperature to the last set point temperature.

2. The method of claim 1, further comprising:
adding one or more sensing devices on the calibration surface.

3. The method of claim 2, wherein the one or more sensing devices comprises one or more thermocouples.

4. The method of claim 2, wherein the one or more sensing devices comprises one or more temperature indicating stickers.

5. The method of claim 2, wherein the first set point temperature is repeatedly incremented to the next set point temperature in twenty-five (25) degrees Celsius (° C.) increments.

6. The method of claim 2, wherein the first set point temperature comprises a value of one hundred fifty (150) degrees Celsius (° C.).

7. The method of claim 6, wherein the last set point temperature comprises a value of six hundred (600) degrees Celsius (° C.).

8. The method of claim 1, wherein the substrate holder system is set to the first set point temperature, the next set point temperature, and the last set point temperature to heat the calibration surface along a range of one hundred (100) degrees Celsius (° C.) to three hundred fifty (350) degrees Celsius (° C.).

9. The method of claim 1, wherein the substrate holder system is set to the first set point temperature, the next set point temperature, and the last set point temperature to heat the calibration surface along a range of two hundred (200) degrees Celsius (° C.) to six hundred (600) degrees Celsius (° C.).

10. The method of claim 1, wherein the substrate holder system is set to the first set point temperature or the last set point temperature to heat the calibration surface to a calibrated deposition temperature at or approximately at three hundred (300) degrees Celsius (° C.).

11. The method of claim 1, wherein the plurality of time and temperature offsets correspond to a plurality of depositions time and temperatures for manufacturing a solar cell.

12. The method of claim 1, wherein the calibration surface comprises a glass surface.

13. The method of claim 1, wherein the calibration surface comprises a surface of a surface of a partially manufactured solar cell or a solar cell.

14. The method of claim 1, wherein the calibration surface comprises a deposition surface of a partially manufactured cadmium (Cd) alloy transmissive solar cell.

15. The method of claim 1, further comprising:
pumping a vacuum chamber of the deposition device to a base pressure; and
pumping the vacuum chamber to raise the base pressure to a sputtering pressure;
providing into the vacuum chamber a first gas at a rate that balances a flow of the first gas in and out of the vacuum chamber with respect to the sputtering pressure; and
providing into the vacuum chamber a second gas comprising at least a hydrogen gas ($H_2$) at a proportional rate to achieve a target gas mix while maintaining the sputtering pressure.

16. The method of claim 15, wherein the first gas comprises argon gas (Ar).

17. The method of claim 15, wherein the target gas mix comprise the hydrogen gas ($H_2$) at or below 1.00%.

18. The method of claim 15, wherein the target gas mix comprises the hydrogen gas ($H_2$) at or approximately at 0.1%.

19. The method of claim 15, wherein the hydrogen gas ($H_2$) comprises a preblended hydrogen gas mix.

20. The method of claim 15, wherein the hydrogen gas ($H_2$) and the first gas are provided across a plurality of phases to achieve the target gas mix.

* * * * *

UNITED STATES PATENT AND TRADEMARK OFFICE
CERTIFICATE OF CORRECTION

| | |
|---|---|
| PATENT NO. | : 12,408,469 B1 |
| APPLICATION NO. | : 19/098014 |
| DATED | : September 2, 2025 |
| INVENTOR(S) | : Kurt G. Conti, Cullin J. Wible and Tim Gessert |

It is certified that error appears in the above-identified patent and that said Letters Patent is hereby corrected as shown below:

On the Title Page

1. On Page 4, Item (56), under "OTHER PUBLICATIONS", in Column 1, Line 55, delete "Mccandless et al.," and insert -- McCandless et al., --, therefor.

2. On Page 4, Item (56), under "OTHER PUBLICATIONS", in Column 2, Lines 9-12, delete "at"https"//static1.squarespace.com/static/57a12f572968714a21ab938d/t/5e509ebbdbfcb2688ef27902/1582341820082/Prism+Solar+-+BN72+-+Gen2+-+360-370W+-+v1.2pdf" and insert -- at https//static1.squarespace.com/static/57a12f572968714a21ab938d/t/5e509ebbdbfcb2688ef27902/1582341820082/Prism+Solar+-+BN72+-+Gen2+-+360-370W+-+v1.2pdf --, therefor.

In the Specification

3. In Column 3, Line 60, delete "generate" and insert -- generating --, therefor.

4. In Column 4, Line 17, delete "embodiments; and" and insert -- embodiments; --, therefor.

5. In Column 6, Line 31, delete "elements of the" and insert -- elements --, therefor.

6. In Column 8, Line 44, delete "can be also be" and insert -- can also be --, therefor.

7. In Column 9, Line 8, delete "and cadmium" and insert -- cadmium --, therefor.

8. In Column 9, Line 23, delete "can include" and insert -- can --, therefor.

9. In Column 10, Line 2, delete "nanometer" and insert -- nanometers --, therefor.

10. In Column 11, Line 3, delete "nanometer" and insert -- nanometers --, therefor.

Signed and Sealed this
Second Day of December, 2025

John A. Squires
*Director of the United States Patent and Trademark Office*

CERTIFICATE OF CORRECTION (continued)
U.S. Pat. No. 12,408,469 B1

11. In Column 11, Line 15, delete "can include can include" and insert -- can include --, therefor.

12. In Column 11, Line 38, delete "contact." and insert -- contact). --, therefor.

13. In Column 11, Line 67, delete "can be also be" and insert -- can also be --, therefor.

14. In Column 12, Line 2, delete "millimeters" and insert -- millimeter --, therefor.

15. In Column 12, Line 5, delete "of" and insert -- or --, therefor.

16. In Column 14, Line 20, delete "supply" and insert -- supply of --, therefor.

17. In Column 16, Line 21, delete "(C)." and insert -- (° C.). --, therefor.

18. In Column 16, Lines 45-46, delete "contaminates" and insert -- contaminants --, therefor.

19. In Column 18, Line 2, delete "be for" and insert -- be --, therefor.

20. In Column 18, Line 3, delete "until normal" and insert -- normal --, therefor.

21. In Column 18, Line 8, delete "in" and insert -- is --, therefor.

22. In Column 18, Line 11, delete "stabilizes," and insert -- stabilized, --, therefor.

23. In Column 18, Line 19, delete "nanometers" and insert -- nanometer --, therefor.

24. In Column 18, Line 24, delete "nanometers" and insert -- nanometer --, therefor.

25. In Column 18, Line 65, delete "particularly" and insert -- particular --, therefor.

26. In Column 19, Line 64, delete "provide in" and insert -- provide --, therefor.

27. In Column 20, Line 1, delete "that the" and insert -- the --, therefor.

28. In Column 20, Line 1, delete "concentration has" and insert -- concentration --, therefor.

29. In Column 20, Line 53, delete "calibrating" and insert -- calibration --, therefor.

30. In Column 20, Line 59, delete "elements of the" and insert -- elements --, therefor.

31. In Column 21, Line 1, delete "the" and insert -- one --, therefor.

32. In Column 21, Line 45, delete "any the" and insert -- the --, therefor.

CERTIFICATE OF CORRECTION (continued)
U.S. Pat. No. 12,408,469 B1

33. In Column 21, Line 56, delete "minutes)." and insert -- minutes. --, therefor.

34. In Column 21, Line 59, delete "the rate" and insert -- rate --, therefor.

35. In Column 21, Line 63, delete "(C)" and insert -- (° C.) --, therefor.

36. In Column 22, Line 15, delete "that is" and insert -- that --, therefor.

37. In Column 22, Line 16, delete "be a" and insert -- be --, therefor.

38. In Column 22, Line 34, delete "of thereof." and insert -- thereof. --, therefor.

In the Claims

39. In Column 24, Line 10, in Claim 13, delete "a surface of a surface of" and insert -- a surface of --, therefor.

40. In Column 24, Line 17, in Claim 15, delete "pressure; and" and insert -- pressure; --, therefor.